US005483479A

United States Patent [19]
Osawa et al.

[11] Patent Number: 5,483,479
[45] Date of Patent: Jan. 9, 1996

[54] ASSOCIATIVE STORAGE MEMORY

[75] Inventors: Nobuyuki Osawa; Ichiro Tomioka; Mitsuhiro Deguchi, all of Itami, Japan

[73] Assignee: Mitsubishi Denki Kabushiki Kaisha, Tokyo, Japan

[21] Appl. No.: 50,850

[22] Filed: Apr. 21, 1993

[30] Foreign Application Priority Data

Apr. 22, 1992 [JP] Japan .................................. 4-102779

[51] Int. Cl.⁶ ...................................... G11C 15/04
[52] U.S. Cl. .................. 365/49; 365/189.07; 365/203
[58] Field of Search ............................... 365/49, 189.07, 365/190, 203

[56] References Cited

U.S. PATENT DOCUMENTS

| | | | |
|---|---|---|---|
| 4,670,858 | 6/1987 | Almy | 365/49 |
| 5,239,642 | 8/1993 | Gutierrez et al. | 365/49 X |
| 5,299,147 | 3/1994 | Holst | 365/49 |

FOREIGN PATENT DOCUMENTS

| | | |
|---|---|---|
| 63-201999 | 8/1988 | Japan . |
| 0355913 | 8/1991 | Japan . |

*Primary Examiner*—Do Hyun Yoo
*Attorney, Agent, or Firm*—Mark Catan; Alfred W. Froebrich; Thomas R. Morrison

[57] ABSTRACT

A memory cell for an associative storage memory device includes a transmission gate which is rendered conductive or non-conductive in response to a potential on a word line for transferring information between an information hold circuit and a bit line or between the information hold circuit and an inverted bit line. Match line are precharged to ground and supply potentials, respectively, and, thereafter, a retrieval circuit compares information on the bit line or inverted bit line with information held in the information hold circuit and produces a control signal to control the potentials on the match lines in accordance with the result of comparison. After the match lines are precharged, a gating circuit is rendered conductive in response to potentials on output control line and inverted output control line to thereby couple the control signal to the match lines.

9 Claims, 16 Drawing Sheets

| A | B | Y |
|---|---|---|
| 0 | 0 | 0 |
| 0 | 1 | 1 |
| 1 | 1 | 0 |

ASSOCIATIVE STORAGE MEMORY

This invention relates to an associative storage memory device which is capable of examining whether or not stored information corresponds to externally applied retrieval information. This invention also relates to a match detecting circuit for coupling a result of information retrieval from the associative storage memory to a RAM, and also a semiconductor memory device employing such an associative storage memory device and a match detecting circuit.

BACKGROUND OF THE INVENTION

An associative storage memory is a device which is capable of indicating whether retrieved information is stored in it. When the information stored matches the retrieval information then the contents of an associated memory are read out. FIG. 1 shows an example of prior art associative storage memory which has a plurality of information retrieval words 170, 170, . . . , 170. These information retrieval words 170 correspond to respective words 172, 172, . . . , 172 of separately provided RAM's. Information identifying the stored contents of the respective RAM words 172 is stored in the respective corresponding associative storage memory words 170. When retrieval information is applied to the retrieval words 170, stored in the corresponding RAM word corresponds to that retrieval information is read out.

Each of the information retrieval words 170 comprises a plurality of memory cells 174. One memory cell 174 is shown in detail in FIG. 2. Each memory cell 174 includes an information hold circuit 180 which comprises a flip-flop circuit formed by two inverters 182 and 184 each having its input connected to the output of the other. The input of the inverter 182 and the output of the inverter 184 are connected to a bit line 188 through the source-drain conduction path of an N-channel MOS transistor 186 which acts as a transfer gate. Similarly, the input of the inverter 184 and the output of the inverter 182 are connected to a bit line 192 through the source-drain conduction path of an N-channel MOS transistor 190 which acts as a transmission gate. The gates of the MOS transistors 186 and 190 are connected to a word line 194.

The memory cell 174 also includes a retrieval circuit 196. The retrieval circuit 196 includes N-channel MOS transistors 200 and 202 having their source-drain conduction paths connected in series with each other between a match line 198 and a ground potential point. The gate of the transistor 200 is connected to the bit line 188, and the gate of the transistor 202 is connected to the the input of the inverter 184 and to the output of the inverter 182. The retrieval circuit 196 also includes N-channel MOS transistors 204 and 206 having their source-drain conduction paths connected in series between the match line 198 and and ground potential point. The gate of the transistor 204 is connected to the bit line 192, and the gate of the transistor 206 is connected to the input of the inverter 182 and to the output of the inverter 184.

When stored information is read out from the memory cell 174, the bit lines 188 and 192 are first precharged to a high level (e.g. a certain supply potential), and then, the word line 194 is set to the high level to render the transmission gates 186 and 190 conductive. This places the bit line 188 at a level corresponding to an output of the inverter 184 and also places the bit line 192 at a level corresponding to an output of the inverter 182.

When information is written to the memory cell 174, the bit lines 188 and 192 are first precharged to the high level, and, after that, the word line 194 is placed at the high level, which renders the transmission gates 186 and 190 conductive. Thereafter, the bit line 188 is placed at the level of information to be stored, with the bit line 192 placed at the opposite level.

For retrieving information from the memory cell 174, the bit lines 188 and 192 are first precharged to a low level (e.g. ground potential), and, after that, the match line 198 is charged to the high level. To determine if the low level is stored in the information hold circuit 180, the bit lines 188 and 192 are placed at the low and high levels, respectively. Assuming that the voltage level of the output of the inverter 184 corresponds to the stored information of the information hold circuit 180 and low level information is actually stored in the information hold circuit 180, the transistor 202 is conductive, the transistor 206 is non-conductive, and the match line 198 is maintained at the high level. On the other hand, if the stored information of the circuit 180 is at a high voltage level, the transistor 206 is conductive, while the transistor 202 is non-conductive since the output of the inverter 182 is at the low level. Since the bit line 192 is at the high level, the transistor 204 is also conductive. Accordingly, the match line 198 is at the low level. In other words, if the retrieval information matches the stored information, the match line 198 is maintained at the high level, whereas it is placed at the low level if the retrieval information and the stored information do not match.

Referring to in FIGS. 1 and 2, since the retrieval circuits 196 of the respective memory cells 174 of each word 170 are connected in common to the match line 198, the match line 198 is maintained high only when retrieval information applied via the respective bit lines 188 and 192 to each of the memory cell 174 in that word 170 matches information stored in that memory cell 174 for all of the memory cells 174. If match line 198 stays high, the stored information in a word of a RAM to which the matchline 198 maintained at the high level is connected is read out.

Since N-channel MOS transistors are used as transmission gates, the bit lines 188 and 192 are precharged to the supply potential prior to writing or reading to and from the respective memory cells 174, which enables reliable reading and writing operations at a high speed, as is known in the art. Further, the reason why the bit lines 188 and 192 are precharged to the low level prior to retrieval operation is as follows. When the match line 198 is precharged to the high level, the gate of one of the transistors 202 and 206 is necessarily at the high level because the output of either one of the inverters 182 and 184 is necessarily at the high level. Then, if both bit lines 188 and 192 are at the high level, both transistors 200 and 204 becomes conductive, whereby a conduction path is provided either by the transistor 200, 202 or the transistor 204, 206 between the match line 198 and a reference potential point. In that case the match line 198 cannot be precharged to the high level, or even if it can be, significant power will be wasted to accomplish the precharging. This is the reason why the bit lines 188 and 198 are precharged to the low level prior to the retrieval operation.

As described above, with the memory cell described above, the bit lines 188 and 192 must be precharged to the high level prior to performing a read/write operation with respect to the cell. The also the bit lines 188 and 192 must be precharged to the low level prior to the retrieval operation. In other words, each time the memory cell changes its operating mode, the bit lines 188 and 192 must be precharged to the high or low level, which, in turn, necessarily requires power and time for the precharging. This prevents such devices from operating with lower power and at higher speed.

Assume that a memory cell which can operate with a low power and at a high speed can be realized, such improvement will be cancelled if other elements constituting the associative storage memory operate with large power and at low speed. It is, therefore, desirable that such elements can also operate at low power and high speed.

An object of the present invention is to provide an associative storage memory of which memory cells are capable of operating with reduced power consumption and at a high speed.

Another object of the present invention is to provide an associative storage memory in which elements forming the associative storage memory with memory cells operate with reduced power consumption and at a high speed.

SUMMARY OF THE INVENTION

According to one aspect of the present invention, a memory cell for an associative storage memory comprises information hold means, first and second bit lines, and a word line, first and second transmission gate means disposed between said information hold means and said first bit line and between said information hold means and said second bit line, respectively. The first and second transmission gate means are controlled into conduction or non-conduction state in response to the potential on said word line for thereby transferring information between said information hold means and said first bit line or between said information hold means and said second bit line. The memory cell further comprises a first match line which is first precharged to a predetermined potential, and then precharged to a first potential, and a second match line which is first precharged to said predetermined potential and then precharged to a second potential that is different from the first potential. The memory cell also includes retrieval means for comparing information on one of the first and second bit lines with information held in the information hold means and generating a control signal for controlling the potential of the first and second match lines in accordance with the result of comparison. Gate means is disposed between the retrieval means and the first and second match lines, which gate means is maintained in the non-conduction state while the first and second match lines are being precharged, and then placed into the conduction state to couple the control signal to the first and second match lines.

A plurality of sets of first and second bit lines, a plurality of word lines, a plurality of sets of first and second transmission gate means, a plurality of sets of first and second match lines, a plurality of retrieval means, and a plurality of gate means may be used to form a multi-port associative memory cell.

According to another aspect of the present invention, a match detecting circuit is used with a word including a plurality of such associative storage memory memory cells as stated above. The first bit lines of the respective memory cells of the word are connected in common, and the second bit lines are connected also in common. The match detecting circuit of the present invention includes first series means including at least two serially connected MOS transistors of a first conductivity type which are rendered conductive when the first potential is applied to their gates which are connected to the first and second common match lines, respectively, second series means, forming parallel means with the first series means, including at least two serially connected MOS transistors of a second conductivity type which are rendered conductive when said second potential is applied to their gates that are connected to the first and second common match lines, respectively, and third series means connected in series with the parallel means. The third series means includes an MOS transistor of the first conductivity type and an MOS transistor of the second conductivity type which are connected in series with each other with the gate of the first conductivity type MOS transistor connected to the second common match line and with the gate of the second conductivity type MOS transistor connected to the first common match line. The series combination of the parallel means and the third series means is connected to a power supply.

A semiconductor memory device according to the present invention comprises an associative memory having a plurality of words, two match lines for each of the words, which two match lines are precharged to different potentials, and means provided for each word for maintaining the two match lines at said different potentials when information stored in that word matches information to be retrieved and for changing the potential on one of the two match lines when information matching is not obtained. The semiconductor memory device further includes match detecting means for each of the words of the associative memory, to which the two match lines of that word are connected, for producing an output signal at a first state when the associated two match lines are at the different potentials and for changing the output signal from the first state to the second state when the potential of one of the two match lines changes. RAM means is provided, which includes a plurality of RAM words provided for respective ones of the match detecting means, RAM word lines connected to respective ones of the RAM words, and control means having its output connected to the RAM word lines and having its input receiving the output signals of the respective match detecting means, for, when an energizing signal is applied thereto, placing the RAM word corresponding to the match detecting means of which the output signal is in the first state at a readout enabling potential. The semiconductor memory includes means for applying said energizing signal to the control means when the output signal from the match detecting means changes to the second state. Alternatively, in place of the control means, a plurality of gate means may be used, which have their outputs connected to the respective RAM word lines, which receive at their respective inputs the output signals from the respective ones of the match detecting means, and which, when an energizing signal is applied thereto, place the RAM word corresponding to the match detecting means the output signal from which is in the first state.

DETAILED DESCRIPTION OF EMBODIMENTS

Figure 1:
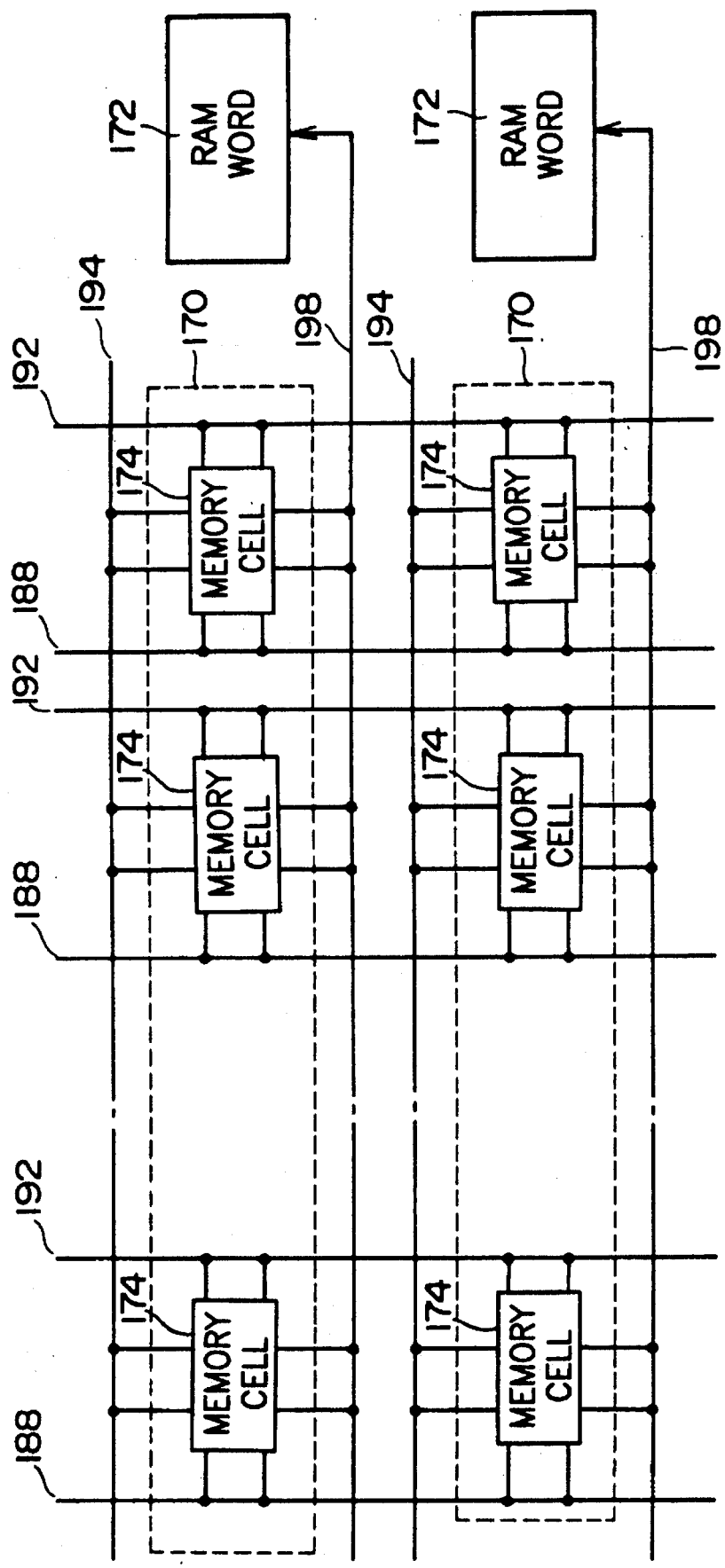
FIG. 1 is a block diagram of a conventional associative memory device.
Figure 2:
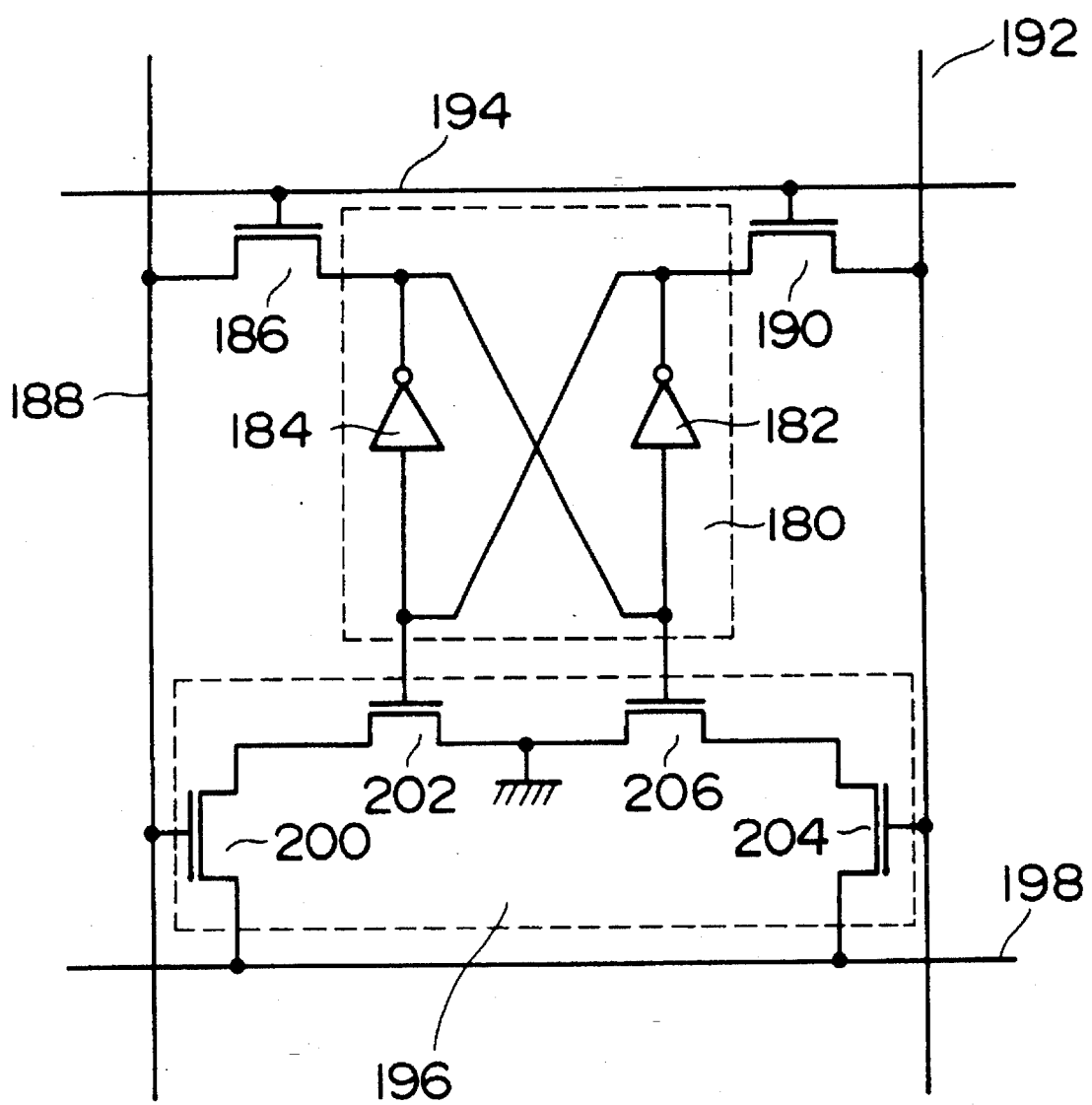
FIG. 2 is a block diagram of an associative memory cell used in the associative memory device of FIG. 1.
Figure 3:
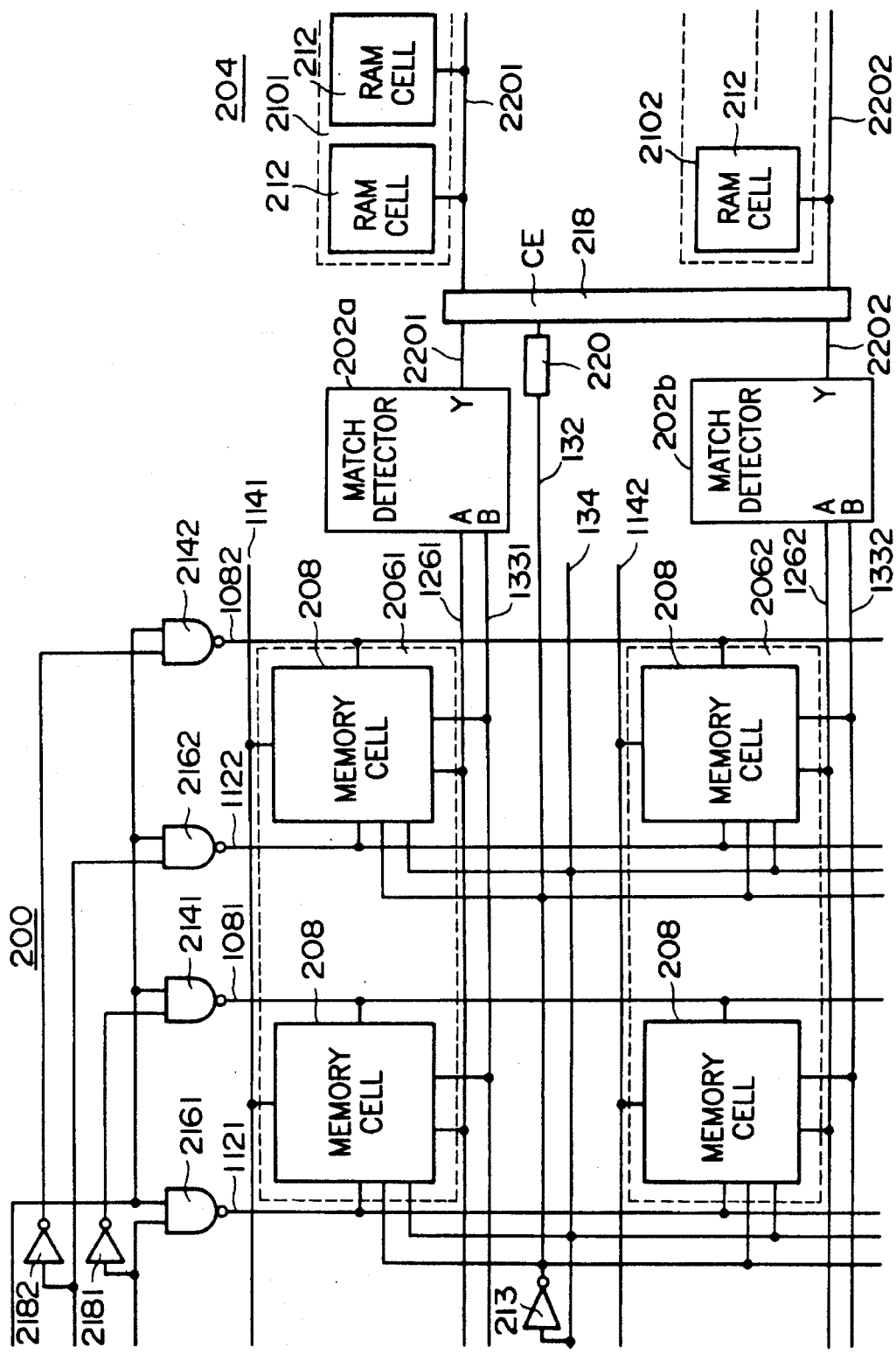
FIG. 3 is a block diagram of a semiconductor memory device according to a first embodiment of the present invention.

A semiconductor memory device according to a first embodiment of the present invention includes an associative memory 200, match detecting circuits 202a, 202b, ..., and a RAM 204, as shown in FIG. 3. The illustrated associative memory 200 includes four words 2061, 2062, etc. each comprising two bits. Only two words 2061 and 2062 are shown and described. Each bit of each word 2061 and 2062 comprises a memory cell 208. The respective four words 2061, 2062 etc. correspond to four RAM words 2101, 2102 etc. of the RAM 204. Only two of the four RAM words are shown and described. Each of the RAM words comprises a plurality of RAM cells 212.

It should be noted that actual semiconductor memory devices comprise a significantly larger number of associative memory words, a larger number of bits of each associative memory word, a larger number of RAM words, and a larger number of bits of each RAM word, but, in the discussion herein, in order to simplify explanation, a semiconductor memory device having only four associative memory words, (with only two of them illustrated) and corresponding numbers of the other components, is described.

As will be described later in detail, retrieval information is compared to the contents of the associative memory 200 during a retrieval mode. If information identical to the retrieval information is stored in, for example, the word 2061, the match is detected by the match detecting circuit 202a and information stored in the corresponding word 2101 in the RAM 204 is read out.

Figure 4:
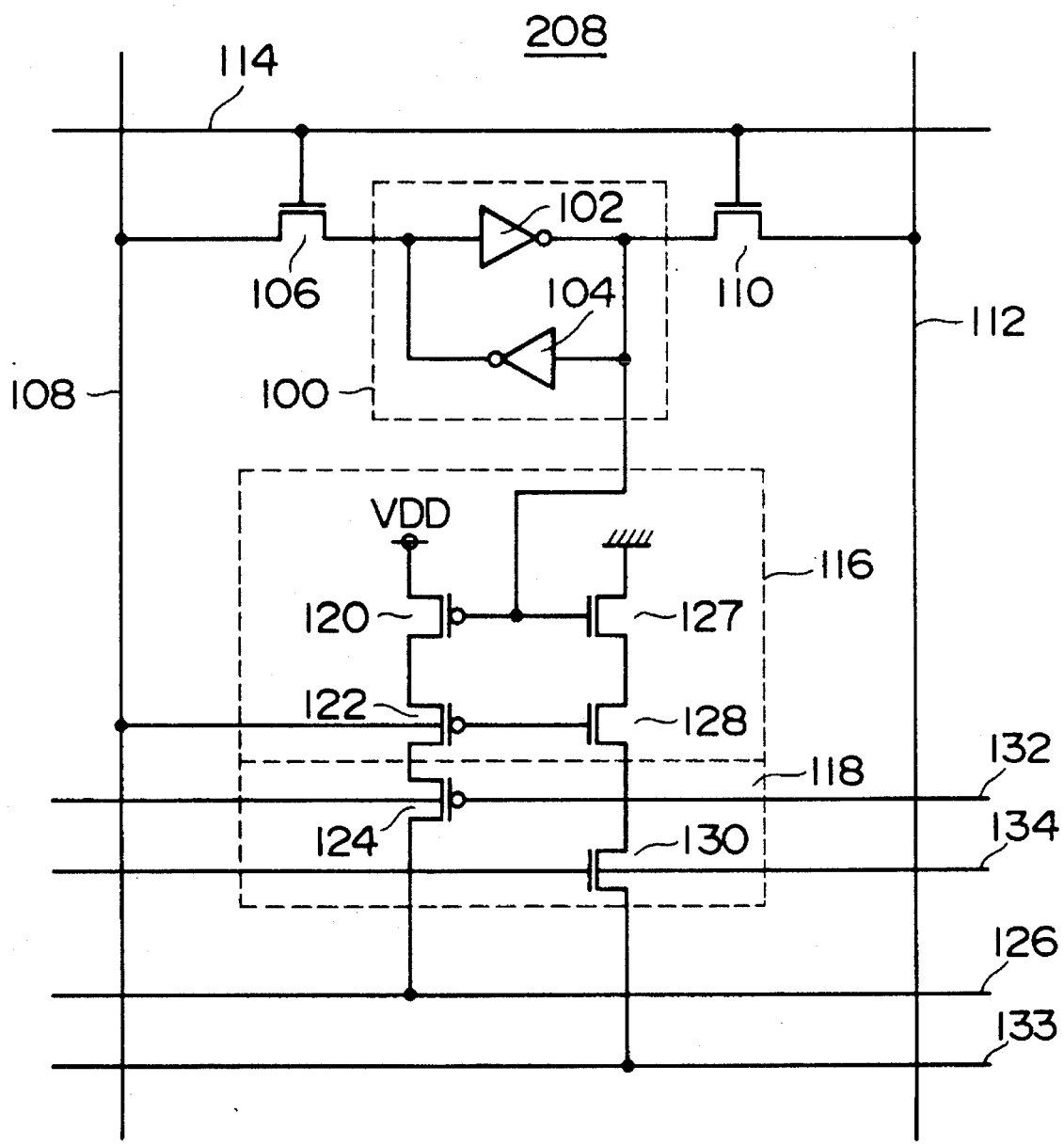
FIG. 4 is a block diagram of an associative memory cell used in the semiconductor memory device of FIG. 3.

As shown in FIG. 4, each memory cell 208 of the associative storage memory 200 of FIG. 3 includes an information hold circuit 100. The information hold circuit 100 comprises a flip-flop comprising two inverters 102 and 104 each having its input cross-coupled to the output of the other inverter. The junction of the input of the inverter 102 and the output of the inverter 104, at which an output signal of the information hold circuit 100 is developed, is connected to a bit line 108 through a transmission gate, e.g. via the drain-source conduction path of an N-channel MOS transistor 106. The junction of the output of the inverter 102 and the input of the inverter 104 is connected to an inverting bit line 112 through a transmission gate, e.g. via the source-drain conduction path of an N-channel MOS transistor 110. The gates of the transistors 106 and 110 are connected to a word line 114.

Referring to FIGS. 3 and 4, all memory cells in the same word are connected in common to the same word line 114. In FIG. 3, such word lines are designated as 1141, 1142, .... The bit line 108 and the inverting bit line 112 are connected to the transistors 106 and 110, respectively, in each of memory cells 208 of corresponding bits of the respective words 2061, 2062, .... The word line 114 is connected respective transistors corresponding to 106 and 110 of all the memory cells 208 in the same word. These bit lines and inverting bit lines, shown in FIG. 3 are designated as bit lines 1081, 1082, ..., and inverting bit lines 1121, 1122, ....

As will be discussed in detail later, the word lines 114, the bit lines 108 and the inverting bit lines 112 are placed at a high or low level, depending on whether the system is in a write mode, a read mode or a retrieval mode, by a control unit (not shown).

The associative storage memory cell 208 includes also a retrieval circuit 116 and a gate circuit 118. The retrieval circuit 116 includes P-channel MOS transistors 120 and 122 having their source-drain conduction paths connected in series, with the source of the transistor 120 connected to a point of supply voltage potential +VDD and with the drain of the transistor 122 connected to a match line 126 through the source-drain conduction path of a P-channel MOS transistor 124 of the gate circuit 118.

Similarly, the retrieval circuit 116 also includes N-channel MOS transistors 127 and 128 having their source-drain conduction paths connected in series, with the source of the transistor 127 connected to a point of ground potential and with the drain of the transistor 128 connected to another match line 133 through the source-drain conduction path of an N-channel MOS transistor 130 of the gate circuit 118. As will be explained later, in the retrieval mode, the match line 126 is precharged to the low level, e.g. ground potential, whereas the match line 133 is precharged to the high level, e.g. supply potential +VDD.

The gates of transistors 120 and 127 are connected to the junction of the output of the inverter 102 and the input of the inverter 104 of the information hold circuit 100, and the gates of the transistors 122 and 128 are connected to the bit line 108. The gate of the transistor 124 of the gate circuit 118 is connected to an inverted output control signal line 132, and the gate of the transistor 130 is connected to an output control signal line 134. The output control signal line 134 is placed at the high level or low level under the control of the control unit of the associative storage memory, depending on the mode of operation, and the inverted output control signal line 132 is placed at the low or high level corresponding to the inverse of the signal on the output control signal line 134 by an inverter 213 shown in FIG. 3.

The match line 126 is connected in common to respective transistors corresponding to transistor 124 of each of the memory cells 208 in the same word, while the match line 133 is connected to the transistors in common to respective transistors corresponding to 130 of each of the memory cells 208 in the same word. Match lines connected in common to transistors 124 and 133 of memory cells 208 in the same words are designated as 1261, 1262, ..., and 1331, 1332, ..., respectively. The output control signal line 134 and the inverted output control line 132 are connected to all of the memory cells 208 of the words 2061, 2062, .... Since the construction of the associative storage memory control unit is not pertinent to the subject of the present invention, its detailed exaplanation is not given herein.

For the information retrieval mode, the bit line 108 and the inverting bit line 112 of each memory cell 208 are precharged to the supply voltage +VDD under the control of the control unit. Further, the output control signal line 134 and the inverted output control signal line 132 are placed at the low level and the high level, respectively, so that the transistors 124 and 130 are rendered non-conductive. Then, the match line 126 is precharged to the low level and the match line 133 is precharged to the high level.

During this precharging operation, the transistors 124 and 130 are non-conductive. Thus, if an output signal provided from the information hold circuit 100, i.e. stored information, at this time, is at the low level, it is inverted by the inverter 102 to a high level signal which is applied to the gate of the transistor 127 so as to render it conductive. Since the bit line 108 is at the high level, the transistor 128 is also conductive, but, since the transistor 130 is non-conductive, current for precharging the match line 133 does not flow into the transistors 127 and 128. Thus, precharging of match line 133 to the supply potential +VDD can be done for a short time without large power consumption.

After the precharging, the bit line 108 is held at a level corresponding to retrieval information and the inverted bit line 112 is held at the level inverse of the level of the retrieval information. For example, if the stored information is at the low level, the transistors 127 and 120 are conductive and non-conductive, respectively. When the bit line 108 and the inverted bit line 112 are held at the low and high levels, respectively, the transistor 122 will become conductive, but the transistors 128 will be non-conductive. Under this condition, if the inverted output control signal line 132 is held at the low level and the output control signal line 134 is held at the high level, the transistors 124 and 130 become conductive, and the match lines 126 and 133 are remain at the low and high levels, respectively.

When the stored information of the information hold circuit 100 is at the low level as stated above and the transistor 127 is conductive, if the high level retrieval information is applied to the bit line 108 and, therefore, the inverted bit line 112 is held at the low level, the gate of the transistor 128 is at the high level and, when the transistors 124 and 130 become conductive, the match line 126 will maintain its low level condition, but the match line 133 will change from the high level to the low level because the transistors 127, 128 and 130 are all conductive.

If the stored information in the information hold circuit 100 is at the high level, the output of the inverter 102 is low and, therefore, the transistors 120 and 127 are respectively conductive and non-conductive. If the retrieval information is high, the bit line 108 is maintained high and the inverted bit line 112 is switched from the high level to the low level. Then, the transistor 122 which had been conductive is rendered non-conductive, while the transistor 128 becomes conductive. Accordingly, the match lines 126 and 133 are maintained at the low and high levels, respectively, because the transistors 122 and 127 are non-conductive even when the transistors 124 and 130 are rendered conductive.

If the information stored in the information hold circuit 100 is at the high level as in the above-stated case, the transistor 120 is conductive as stated above. If retrieval information is at the low level, and, therefore, the bit and inverted bit lines 108 and 112 are placed to the low and high levels, respectively, the low level signal is applied to the gate of the transistor 122 to make it conductive, and, therefore, when the transistors 124 and 130 become conductive, the match line 126 becomes high since the transistors 120, 122 and 124 are conductive. However, since the transistor 127 is non-conductive, the match line 133 is maintained high.

As described above, in this memory cell 208, when the retrieval information and the stored information match with each other, the match line 126 is maintained at the low level and the match line 133 is maintained at the high level. If they do not match, the level of the match line 126 or 133 changes. Since one match line 126 and one match line 133 are connected to the cell of the same word, only when matching of the stored information with the retrieval information occurs in all of the memory cells in the same word, the match lines 126 and 133 are maintained respectively at the low and high levels.

For writing information into each memory cell 208, the bit line 108 and the inverted bit line 112 are first precharged to the high level, and then, the word line 114 is placed to the high level. This renders the transistors 106 and 110 conductive. After that, the bit line 108 is placed to a level corresponding to the information to be written into the cell, and the inverted bit line 112 is placed to the opposite level. This forces the information in the information hold circuit 100 to at the same level as the bit line 108. After the writing operation, the word line 114 is switched to the low level.

To read information from the memory cell 208, the bit line 108 and the inverted bit line 112 are precharged to the high level. After that, the word line 114 is held at the high level to render the transistors 106 and 110 conductive. This places the bit line 108 at the same level as the stored information in the information hold circuit 100, and the inverted bit line 112 the opposite level.

The purpose of precharging the bit line 108 and the inverted bit line 112 to the high level prior to the reading or writing operation is to realize speedy and reliable reading and writing operations, which would otherwise be impeded by the use of the N-channel transistors 106 and 110 as transmission gates, as is known. In addition, in the retrieval mode, too, the bit line 108 and the inverted bit line 112 are precharged to the high level prior to initiating the retrieval operation. Thus, in all operating modes, precharging to the high level only is required.

For this precharging operation, the bit lines 1081 and 1082, and the inverted bit lines 1121 and 1122 are connected to NAND gates 2141 and 2142 and NAND gates 2161 and 2162, respectively. The NAND gates 2141 and 2142 receive bit signals from the control unit (which bit signals are at the levels to which the bit lines 1081 and 1082 are placed in the respective operating modes) after they are inverted by inverters 2181 and 2182, respectively, and also a precharge control signal from the control unit. The NAND circuit 2161 and 2162 receive the non-inverted versions of the respective bit signals and the precharge control signal from the control unit.

An NAND circuit provides a high level output signal when one input signal thereto is at the low level, regardless of the level of the other input signal, and if one input signal is at the high level, the output signal is the inverse of the other output. Accordingly, by placing the precharge control signal at the low level by means of the control unit during the precharging operation, the respective NAND circuits 2141, 2142, 2161 and 2162 provide the high level output signals to the bit lines 1081, 1082, 1121 and 1122, respectively. In each of the operating modes, the precharge control signal is placed at the high level. Then, the bit signals are inverted by the inverters 2181 and 2182 and again inverted by the NAND gates 2141 and 2142 to the initial levels, respectively for application to the respective bit lines 1081 and 1082. The same bit signals are inverted by the NAND circuits 2161 and 2162 and applied to the inverted bit lines 1121 and 1122.

Various modifications are possible to the memory cells 208.

Figure 5:
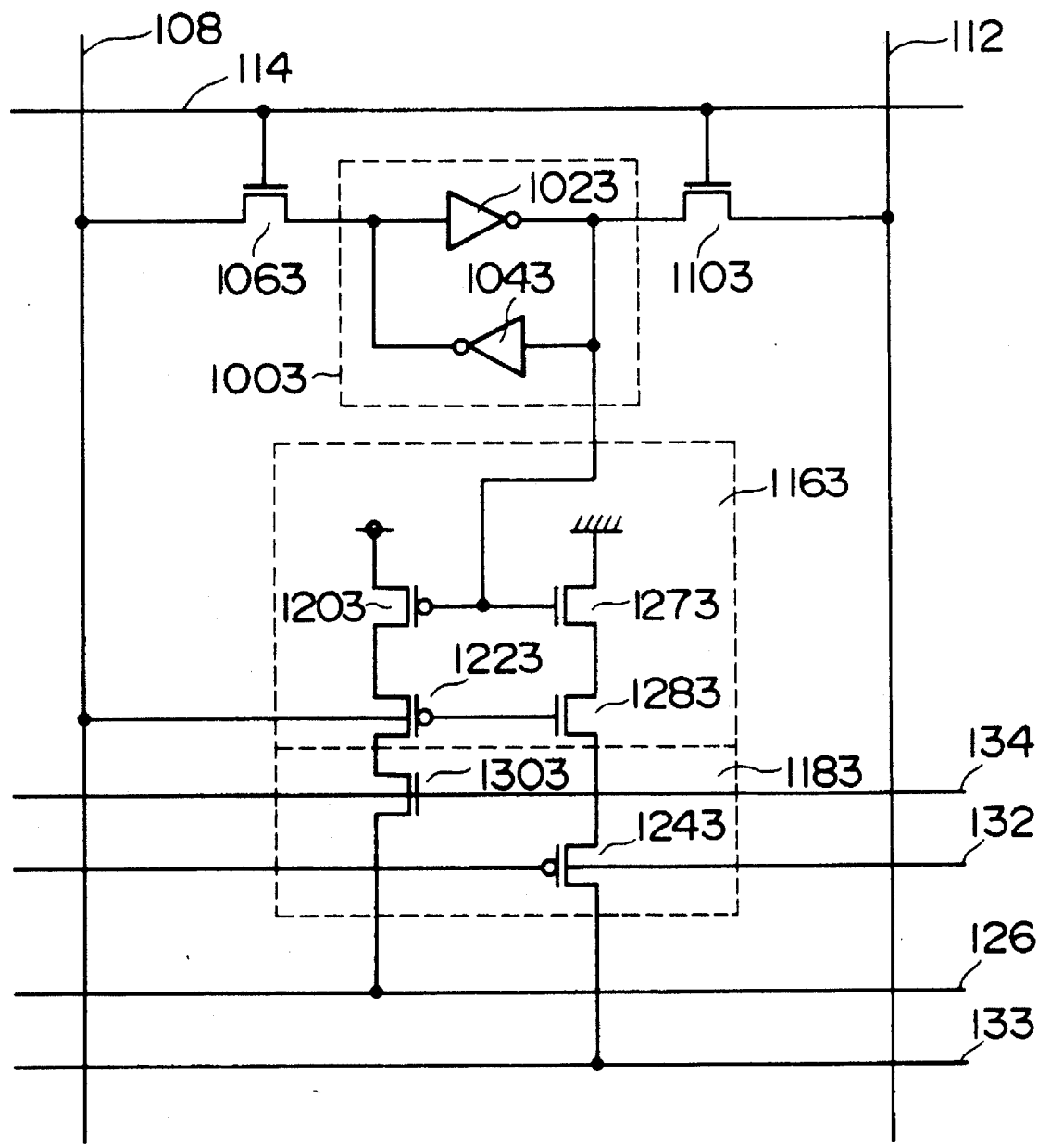
FIG. 5 shows a first modified version of the memory cell of FIG. 4.

For example, as shown in FIG. 5, in a memory cell 2083 a gate circuit 1183 may include a P-channel MOS transistor 1243 and an N-channel MOS transistor 1303 which are connected to an N-channel MOS transistor 1283 and a P-channel MOS transistor 1223 of a retrieval circuit 1163, respectively. The connections of the remaining circuit components are the same as in the cell 208 shown in FIG. 4, and they are indicated by an additional numeral "3" attached to the end of each reference numeral used in FIG. 4, and since the operation is the same as discussed with reference to FIG. 4, no further explanation is required. The operation of the memory cell 2083 of FIG. 5 is the same as that of the memory cell 208 of FIG. 4.

Figure 6:
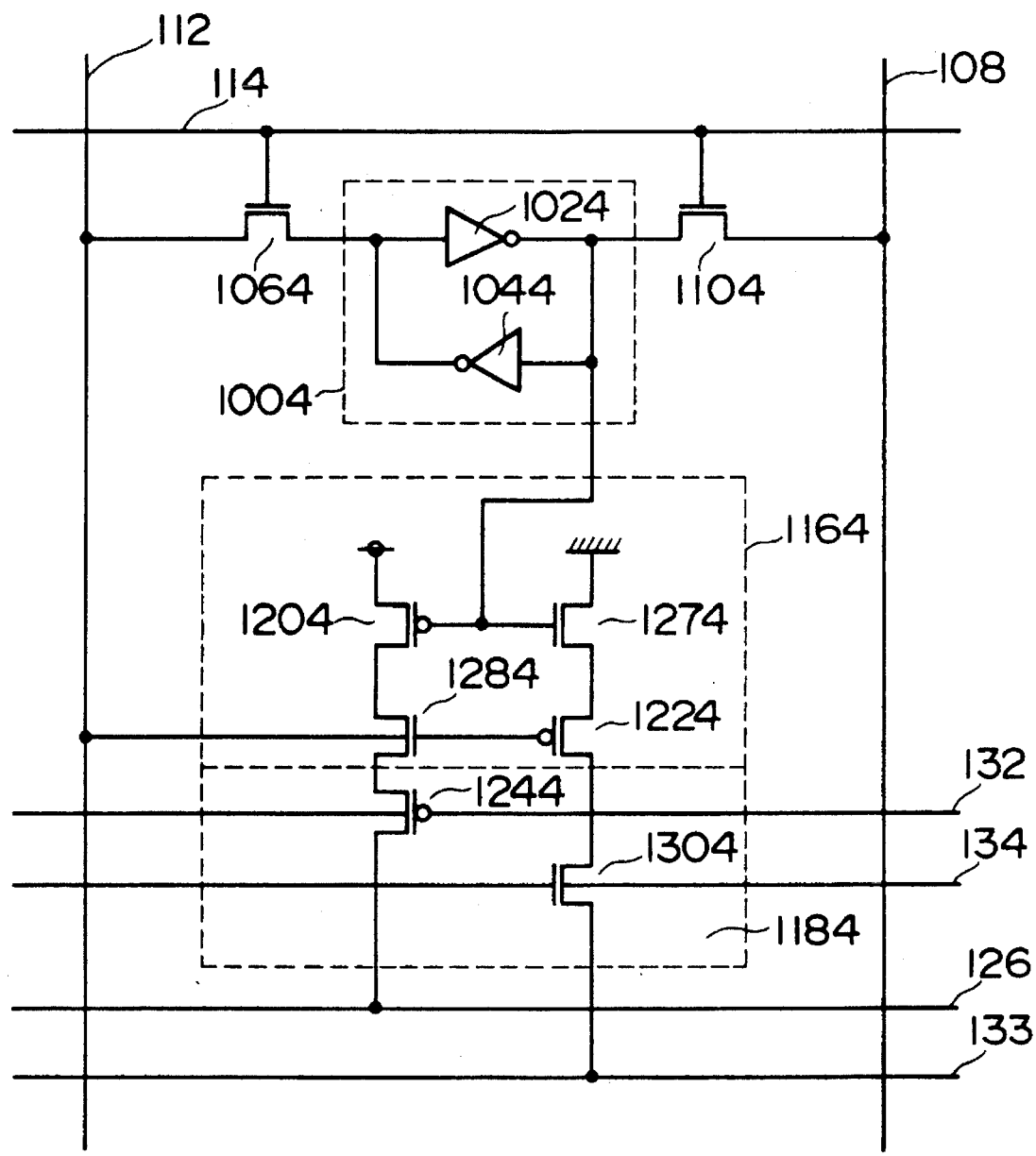
FIG. 6 shows a second modified version of the memory cell of FIG. 4.

Another modification is shown in FIG. 6. In a retrieval circuit 1164, an N-channel MOS transistor 1284 is connected in series with a P-channel MOS transistor 1204, and a P-channel MOS transistor 1224 is connected in series with an N-channel MOS transistor 1274. In this case, however, the gates of the transistors 1224 and 1284 are connected to the inverted bit line 112. The remaining portion of the memory cell 2084 of FIG. 6 is the same as that of the cell 204 of FIG. 4. The corresponding components in FIG. 6 include an additional reference numeral "4" at the end of their reference numerals used in FIG. 4. The memory cell 2084 of FIG. 6 operates in the same way as the cell 204 of FIG. 4. Alternatively, the gates of the transistors 1224 and 1284 may be connected to the bit line 108 rather than the inverted bit line 112, but, in such a case, the gates of the transistors 1204 and 1274 should be connected to the junction of the input of the inverter 1024 and the output of the inverter 1044.

Figure 7:
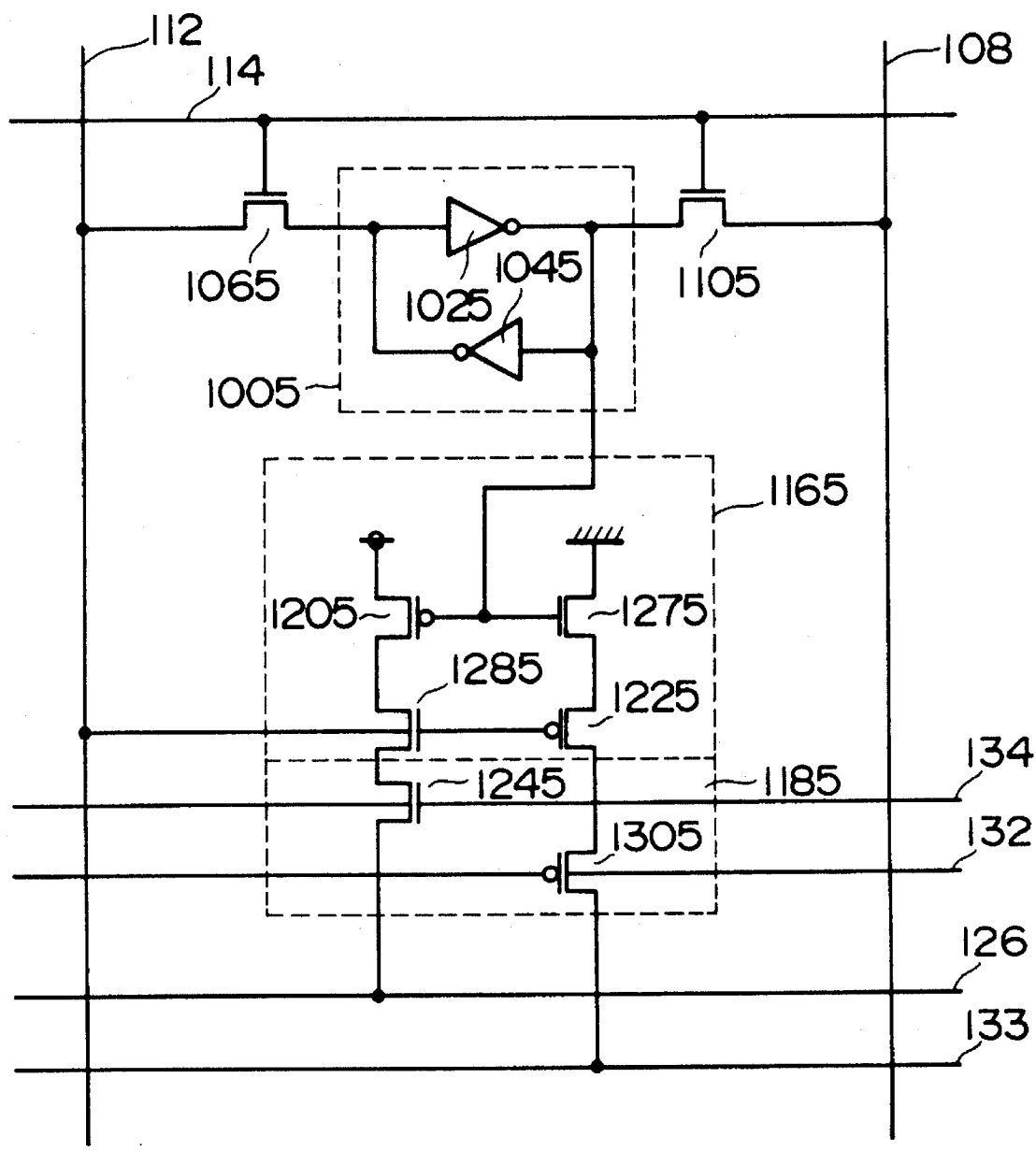
FIG. 7 shows a third modified version of the memory cell of FIG. 4.

As shown in FIG. 7, a retrieval circuit 1165 may comprise, as the retrieval circuit 1164 shown in FIG. 6, a series circuit of a P-channel MOS transistor 1205 and an N-channel MOS transistor 1285, and a series circuit of an N-channel MOS transistor 1275 and a P-channel MOS transistor 1225, and a gate circuit 1185 may comprise an N-channel MOS transistor 1245 and a P-channel MOS transistor 1305 with the source-drain conduction path of the transistor 1245 connected to the match line 126 and to the source-drain conduction path of the N-channel MOS transistor 1285 and with the source-drain conduction path of the transistor 1305 connected to the match line 133 and to the source-drain conduction path of the P-channel transistor 1225. The connections of the remaining components with an additional reference numeral "5" attached at the end of the respective corresponding components shown in FIG. 4 are the same as in FIG. 4, and, therefore, no further explanation of them is required. The memory cell 2085 of FIG. 7 operates in the same way as the cell 208 of FIG. 4.

Figure 8:
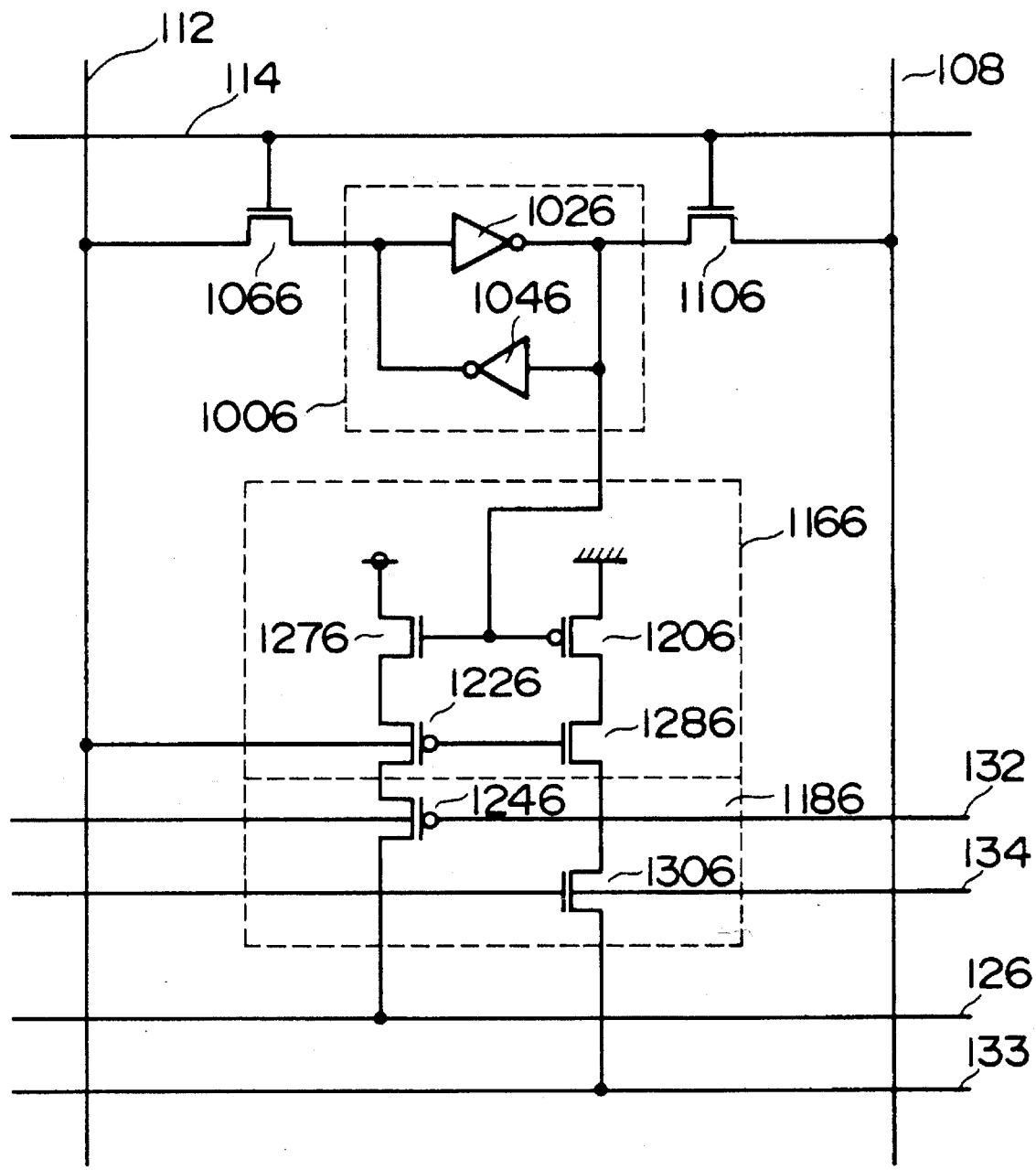
FIG. 8 shows a fourth modified version of the memory cell of FIG. 4.

FIG. 8 shows another modification to the memory cell 208 of FIG. 4. A retrieval circuit 1166 of FIG. 8 comprises a series combination of an N-channel MOS transistor 1276 and a P-channel transistor 1226 with the transistor 1276 connected to the supply potential +VDD and with the transistor 1226 connected to a P-channel MOS transistor 1246 of a gate circuit 1186 which is the same as the gate circuit 118 of FIG. 4. The retrieval circuit 1166 further includes a series combination of a P-channel MOS transistor 1206 and an N-channel MOS transistor 1286 with the transistor 1206 connected to ground potential and with the transistor 1286 connected to an N-channel MOS transistor 1306 of the gate circuit 1186. The gates of the P-channel MOS transistor 1226 and the N-channel MOS transistor 1286 are connected to the inverted bit line 112. The remaining portion of the cell 2086 of FIG. 8 is same as the cell 208 of FIG. 4. An additional reference numeral "6" is attached to the end of the reference numeral of each of the corresponding components shown in FIG. 4. The memory cell 2086 operates in the same way as the memory cell 208 of FIG. 4.

Figure 9:
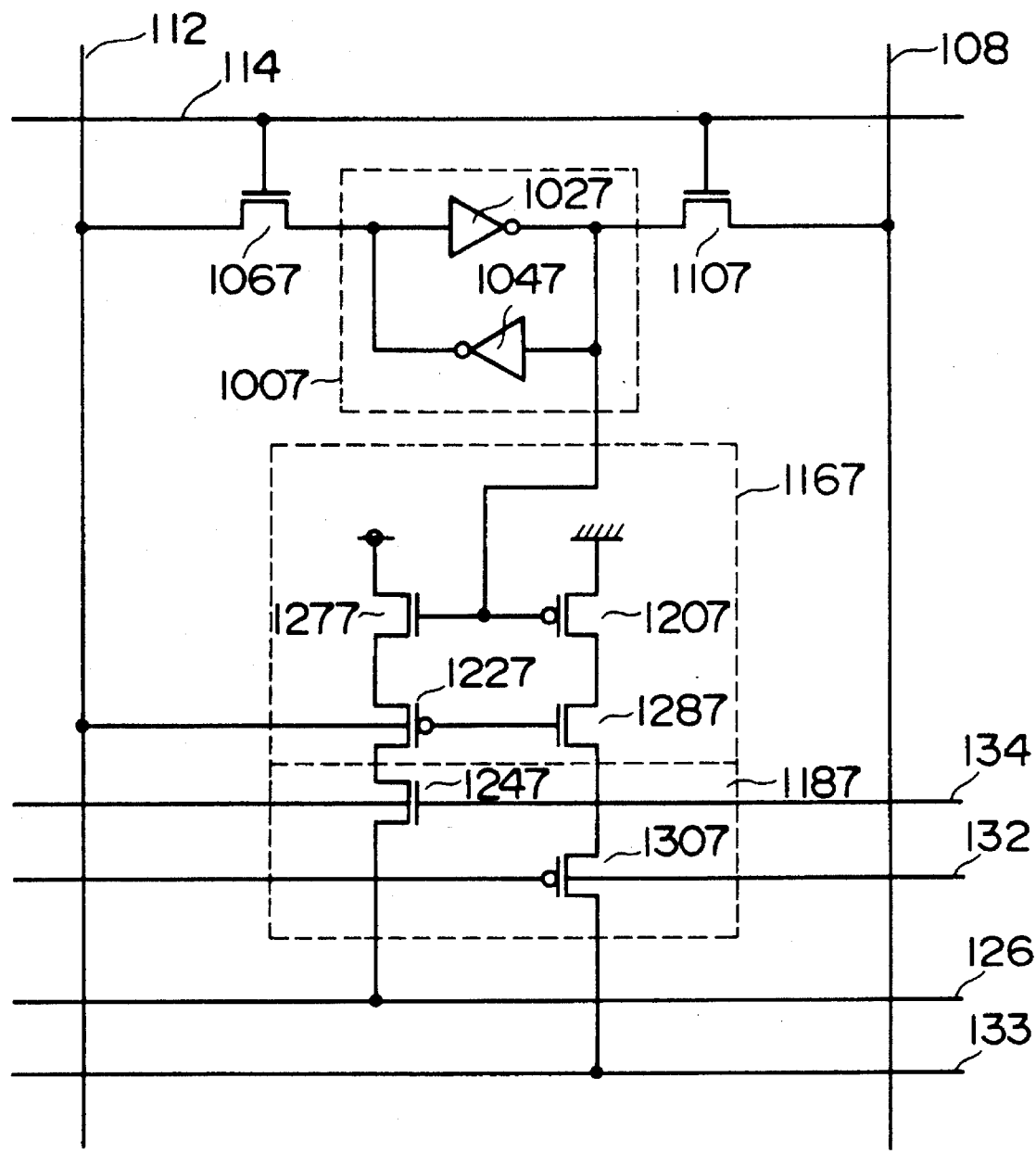
FIG. 9 shows a fifth modified version of the memory cell of FIG. 4.

As shown in FIG. 9, a memory cell 2087 may comprise a retrieval circuit 1167 having the same structure as the retrieval circuit 1166 of FIG. 8 and a gate circuit 1187 including an N-channel MOS transistor 1247 connected to the match line 126 and a P-channel MOS transistor 1307 connected to the match line 133 as in the gate circuit 1183 of FIG. 5. The configuration of the remaining portion of the memory cell 2087 is the same as shown in FIG. 4. An additional reference numeral "7" is attached to the end of the reference numeral of each of the corresponding components shown in FIG. 4. The memory cell 2087 operates in the same way as the memory cell 208 of FIG. 4.

Figure 10:
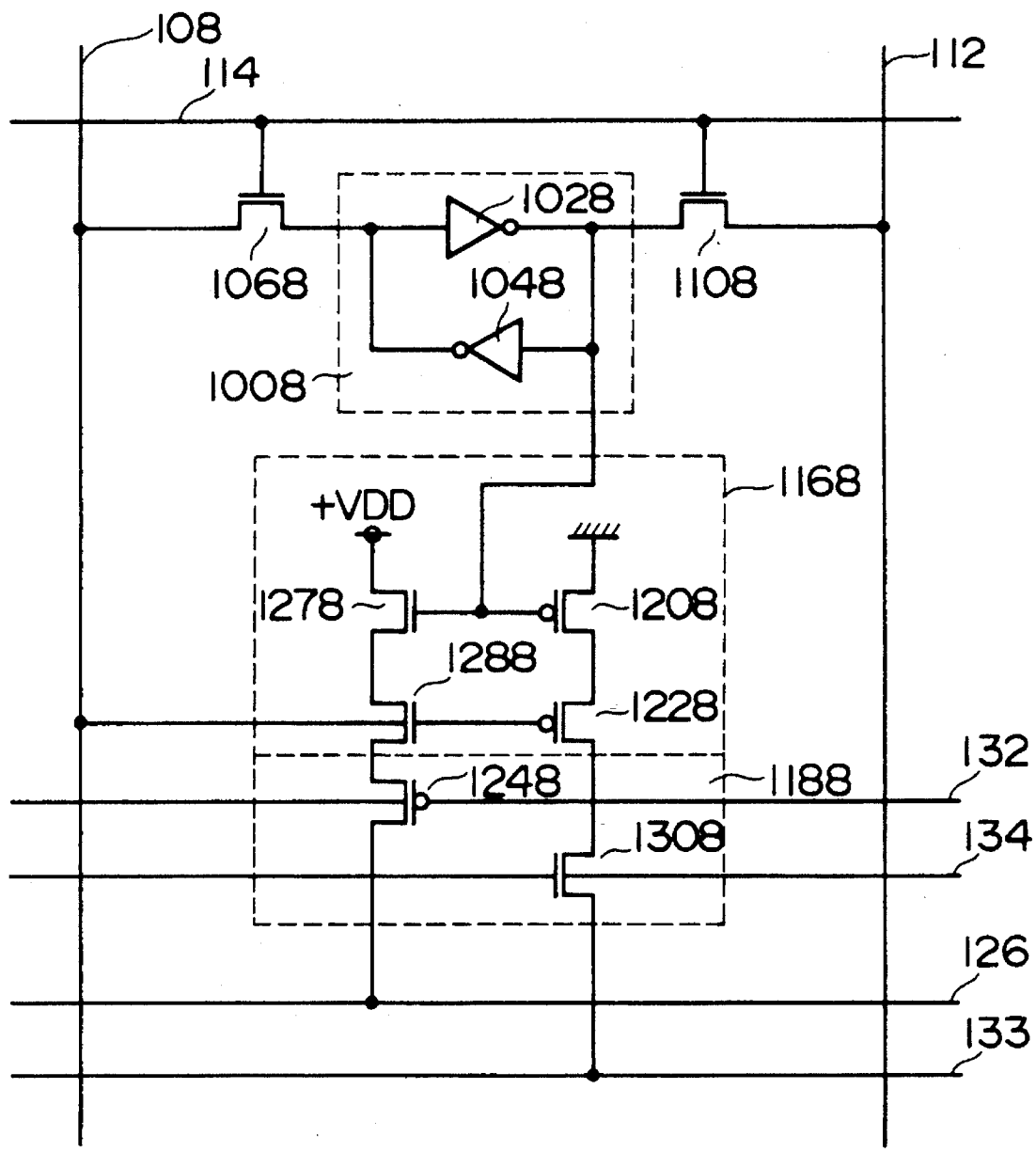
FIG. 10 shows a sixth modified version of the memory cell of FIG. 4.

A retrieval circuit 1168 of a memory cell 2088 shown in FIG. 10 comprises N-channel MOS transistors 1278 and 1288 having their source-drain conduction paths connected in series between the supply potential +VDD and a P-channel MOS transistor 1248 of a gate circuit 1188, and also P-channel MOS transistors 1208 and 1228 having their source-drain conduction paths connected in series between ground and an N-channel MOS transistor 1308 of the gate circuit 1188. The gates of the N-channel MOS transistor 1288 and the P-channel MOS transistor 1228 are connected to the bit line 108. The remaining portion of the memory cell 2088 shown in FIG. 10 is the same as the memory cell 208 shown in FIG. 4. An additional reference numeral "8" is attached to the end of the reference numeral of each of the corresponding components shown in FIG. 4. This memory cell 2088 operates in the same way as the memory cell 208.

Figure 11:
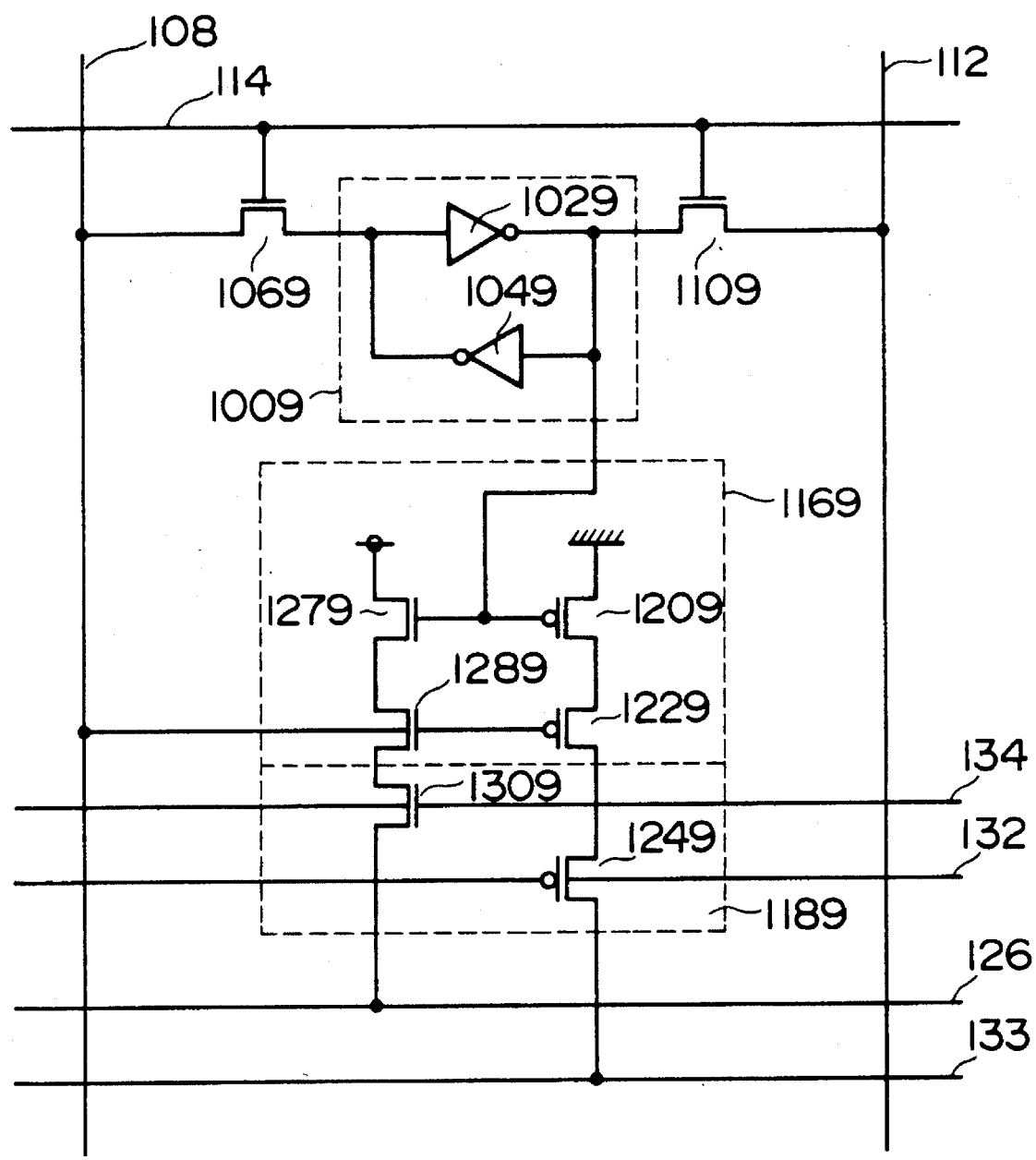
FIG. 11 shows a seventh modified version of the memory cell of FIG. 4.

FIG. 11 shows another modification of a memory cell. A memory cell 2089 shown in FIG. 11 comprises a retrieval circuit 1169 which has the same configuration as the retrieval circuit 1168 shown in FIG. 10, and a gate circuit 1189 which comprises an N-channel MOS transistor 1309 connected between the match line 126 and an N-channel MOS transistor 1289 of the retrieval circuit 1169 and a P-channel MOS transistor 1249 connected between the match line 133 and a P-channel MOS transistor 1229 of the retrieval circuit 1169. The configuration of the remaining portion of the memory 2089 is the same as that of the memory cell 208 shown in FIG. 4. An additional reference numeral "9" is attached at the end of the reference numeral of each of the corresponding components shown in FIG. 4. The operation of this memory cell 2089 is the same as that of the memory cell 208 of FIG. 4.

In each of the combinations of the retrieval circuits 116, 1163, 1164, 1165, 1166, 1167, 1168 and 1169 with the respective gate circuits 118, 1183, 1184, 1185, 1186, 1187, 1188 and 1189 shown in FIGS. 4–11, the number of N-channel MOS transistors used is three, and the number of P-channel transistors used is also three. When the retrieval circuit and its associated gate circuit are formed in an integrated circuit form, the degree of integration can be improved because of the same number of different conductivity-type MOS transistors.

Referring again to FIG. 3, as described above in detail, according to the present invention, only when stored information in memory cells of a word 2061, 2062 all match the retrieval information, the match line 1261, 1262 of that word assumes and maintains the low level and the match line 1331, 1332 assumes and maintains the high level. A match detecting circuit 202a, 202b is used to indicate this matching between the retrieval information with the stored information to the corresponding word in a RAM 204.

All of the match detecting circuits 202a, 202b, . . . , have the same circuit configuration. Therefore, the configuration of only the match detecting circuit 202a is described with reference to FIG. 12.

Figures 12, 13:
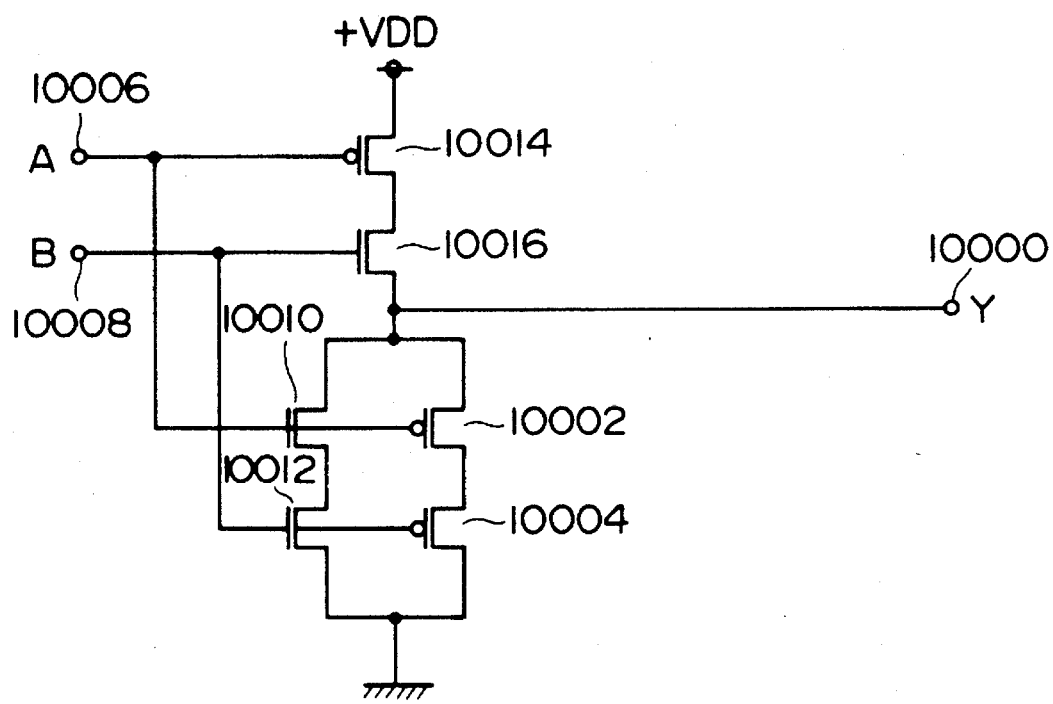
FIG. 12 is a block diagram of a match detecting circuit used in the semiconductor memory device of FIG. 4.
FIG. 13 is a truth table for the match detecting circuit of FIG. 12.

Referring now to FIGS. 3 and 12, the match detecting circuit 202a includes an output terminal 10000. Between the output terminal 10000 and a point of ground potential, the source-drain conduction paths of P-channel MOS transistors 10002 and 10004 are connected in series. The gate of the transistor 10002 is connected to an input terminal 10006 which, in turn, is connected to the match line 1261. The gate of the transistor 10004 is connected to another input terminal 10008 which, in turn, is connected to the match line 1331.

Between the output terminal 10000 and ground potential, or, in other words, in parallel with the series combination of the transistors 10002 and 10004, the source-drain conduction paths of N-channel MOS transistors 10010 and 10012 are connected in series. The gate of the transistor 10010 is connected to the input terminal 10006 and the gate of the transistor 10012 is connected to the input terminal 10008.

Between the output terminal 10000 and the supply potential +VDD, in other words, in series with the parallel combination of the series circuit of the transistors 10002 and 10004 and the series circuit of the transistor 10010 and 10012, the source-drain conduction paths of a P-channel MOS transistor 10014 and an N-channel MOS transistor 10016 are connected in series, with the gate of transistor 10014 connected to the input terminal 10006 and with the gate of the transistor 10016 connected to the input terminal 10008.

In operation, when both of the input terminal 10006 and 10008 are at the low level, i.e. when the retrieval information does not coincide with the stored information, both of the transistors 10002 and 10004 are rendered conductive, the transistors 10010 and 10012 are both non-conductive, the transistor 10014 is conductive, and the transistor 10016 is non-conductive. As a result, the output terminal 10000 is placed at ground potential, i.e. low level.

When both of the input terminals 10006 and 10008 are at the high level, i.e. the retrieval information does not coincide with the stored information, the transistors 10010 and 10012 are conductive, the transistors 10002 and 10004 are non-conductive, the transistor 10014 is non-conductive, and the transistor 10016 becomes conductive. Accordingly, the output terminal 10000 assumes the low level.

When the input terminal 10006 assumes the high level and the input terminal 10008 assumes the low level, which usually does not happen because of the relationship in level between the match lines 126 and 133, the transistors, 10002, 10012, 10014 and 10016 become non-conductive so that the output terminal 10000 exhibits a high impedance state.

When the input terminal 10006 is at the low level and the input terminal 10008 is at the high level, in other words, when the retrieval information corresponds to the stored information as a result of the retrieval operation performed after precharging the match line 126 to the low level and the match line 133 to the high level, the transistors 10004 and 10010 are non-conductive, while the transistors 10014, 10016, 10002 and 10012 become conductive. As a result, the output terminal 10000 assumes the high level.

FIG. 13 shows the relationship between the signal levels at the input terminals 10006 and 10008 and the signal level developed at the output terminal 10000. In FIG. 13, letters "A" and "B" represent signals at the input terminals 10006 and 10008, respectively, and a letter "Y" represents a signal at the output terminal 10000. The output terminal 10000 is at the high level when the match line 126 is placed at the low level and the match line 133 is precharged to the high level. The output terminal 10000 is maintained at the high level when the retrieval information matches the stored information, but it changes from the high level to the low level when the retrieval information does not coincide with the stored information.

The total number of transistors used in the above-described match detecting circuit 202a is six, and the number of the N-channel MOS transistors and that of the P-channel MOS transistor are equal to each other, namely, three. In contrast, the number of transistors used in commercially available circuits which provide similar function to that of the match detecting circuit 202a is greater than six and the numbers of P-channel and N-channel MOS transistors differ from each other. Accordingly, the match detecting circuits of the present invention operate with less power consumption than conventional ones, and, furthermore, the degree of integration, when the match detecting circuit is fabricated in an integrated circuit form, is higher.

The output signal of the match detecting circuits 202a, 202b are coupled to a control unit 218 of the RAM 204. The control unit 218 starts controlling the RAM 204 when a high level signal is applied to its chip enable terminal CE. The control unit 218 operates to change one or more of word lines 2201, 2202, . . . , of the associated RAM words 2101, 2102, . . . , when the corresponding match detecting circuit 202a, 202b which produces the high level output signal. The control unit 218 then reads out the stored information from the RAM words whose word lines were placed at the high level. The control unit 218 also performs other functions, but they are not directly pertinent to the present invention and, therefore, are not described further.

The chip enable terminal CE of the control unit 218 receives also a signal from the inverted output control signal line 132 which has been delayed by a delay circuit 220. The time delay imparted by the delay circuit 220 is determined to be equal to a time period from the time when, for example, the inverted output control signal changes to the high level to the time when the output terminal of a match detecting circuit changes to the low level in response to the detection of mismatch of retrieval information with stored information in a word of the associative memory 200.

Because of this signal to the chip enable terminal, at the beginning of the retrieval operation, all of the word lines 2201, 2202, . . . , of the RAM 204 are at the low level, and only the RAM word line corresponding to the associate memory word for which the stored information matches the retrieval information, is placed at the high level upon the initiation of the operation of the control unit 218. Thus, erroneous operation of the RAM memory cells 212 in response to level transitions on the RAM word lines can be avoided, which can reduce power consumption of the RAM 204 during the retrieval operation.

Usually, there is only one RAM word line which corresponds to the associative memory word containing stored information coincident with retrieval information, and information matching does not occur in associative memory words at which the remaining RAM word lines correspond. Accordingly, if the output signals of the match detecting circuits 202a, 202b, . . . were directly coupled to the RAM word lines 2201, 2202, . . . the RAM word lines 2201, 2202, . . . would be placed to the high level during the precharging of the match lines 126 and 133. In such a case, a large number of RAM word lines which correspond to associative memory words for which information match is not observed would be changed from the high level to the low level. Such an arrangement of the RAM 204 would disadvantageously consume considerable power.

In contrast, according to the present invention, after the chip enable terminal CE of the control unit 218 is placed at the high level, only the RAM word line corresponding to a word of the associative memory 200, for which retrieval information coincides with stored information, is placed to the high level, which can reduce power consumption.

In the arrangement shown in FIG. 3, respective RAM memory cells 212 start operating when the chip enable terminal CE is at the high level. However, cells which start operating when the chip enable terminal CE is at the low level may be used instead. In such a case, an uninverted signal from the output control signal line 134, which has been delayed by a circuit corresponding to the delay circuit 220, should be coupled to the chip enable terminal CE.

Figure 14:
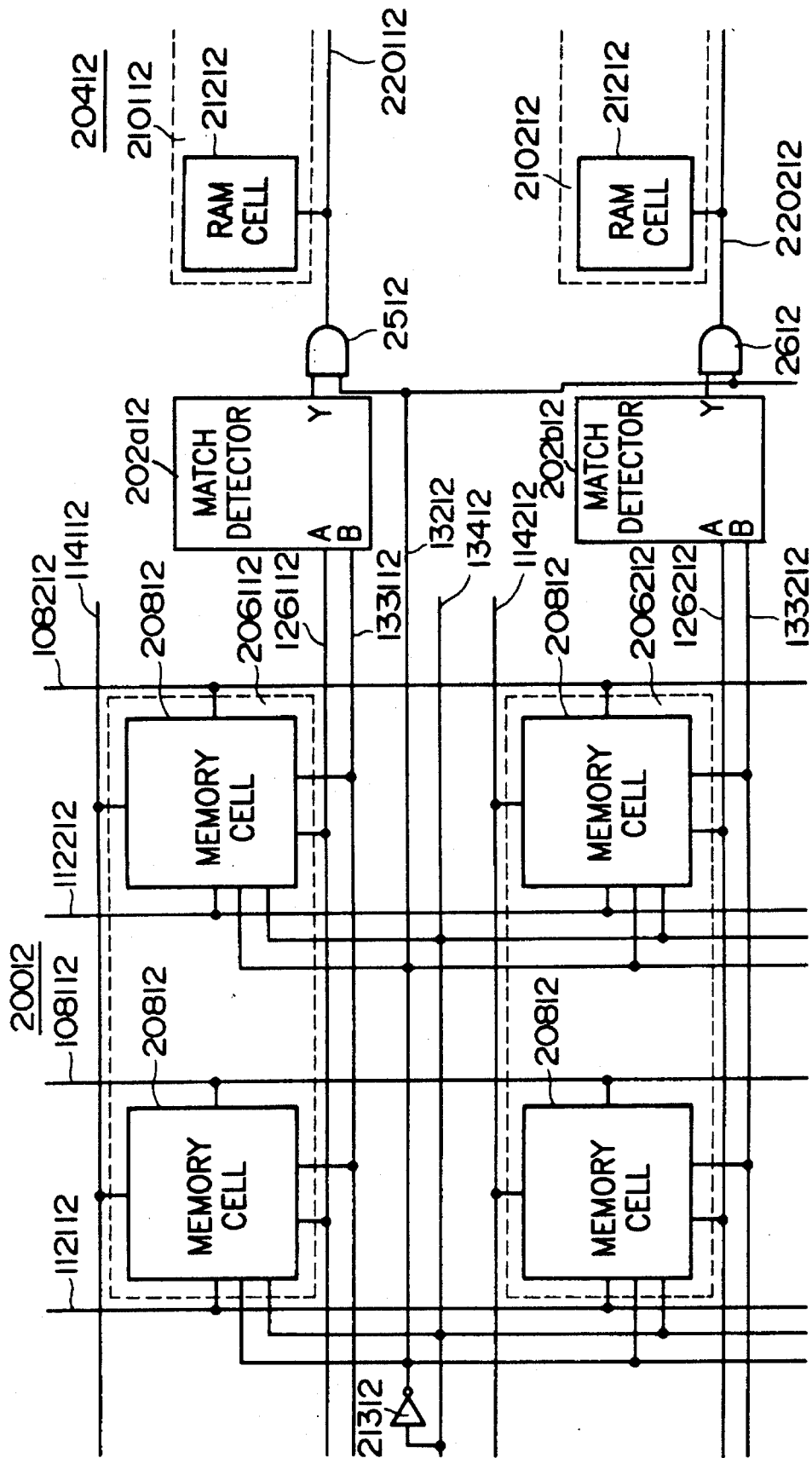
FIG. 14 is a block diagram of a semiconductor memory device according to a second embodiment of the present invention.

FIG. 14 shows an associative storage memory device according to a second embodiment of the present invention. The device has the same construction as that of the device shown in FIG. 3 except for the read-out arrangement for a RAM 20412. An additional reference numeral "12" is attached to the end of the reference numeral of each of the corresponding components shown in FIG. 3.

In the arrangement shown in FIG. 14, output signals from match detecting circuits 202a12, 202b12, . . . are coupled to gating circuits, such as AND circuits 2512, 2612, . . . , which receive a signal on an inverted output control signal line 13212. Outputs of the AND circuits 2512, 2612, . . . are coupled to associated word lines 220112, 220212, . . . of the RAM 20412.

Prior to the retrieval operation, the AND circuits 2512, 2612, . . . supply output signals at the low level to the respective word lines of the RAM 20412, and only when stored information of any of the words of the associative memory 20012 is coincident with retrieval information, an output signal at the high level is applied to the corresponding RAM word lines 220112, 220212, . . . . In other words, only the word line of the word in the RAM 20412 corresponding to the word in the associative memory 20012 for which stored information and retrieval information coincide is placed at the high level, and the remaining RAM word lines are left at the low level. Accordingly, power consumption in the RAM is reduced as in the first embodiment. After any of the word lines of the RAM 20412 is placed at the high level, stored information is read out from the RAM word connected to the RAM word line placed to the high level under the control of a RAM control unit (not shown).

In this second embodiment, the signal on the inverted output control signal line 13212 is used for gating control of the AND gates 2512, 2612, . . . , but a signal on the output control signal line 13412 may be used as the gating control signal by modifying the circuit such that output signals from the match detecting circuits 202a12, 202b12, . . . are inverted by inverters and applied to the AND gates 2512, 2612, . . . .

Figure 15:
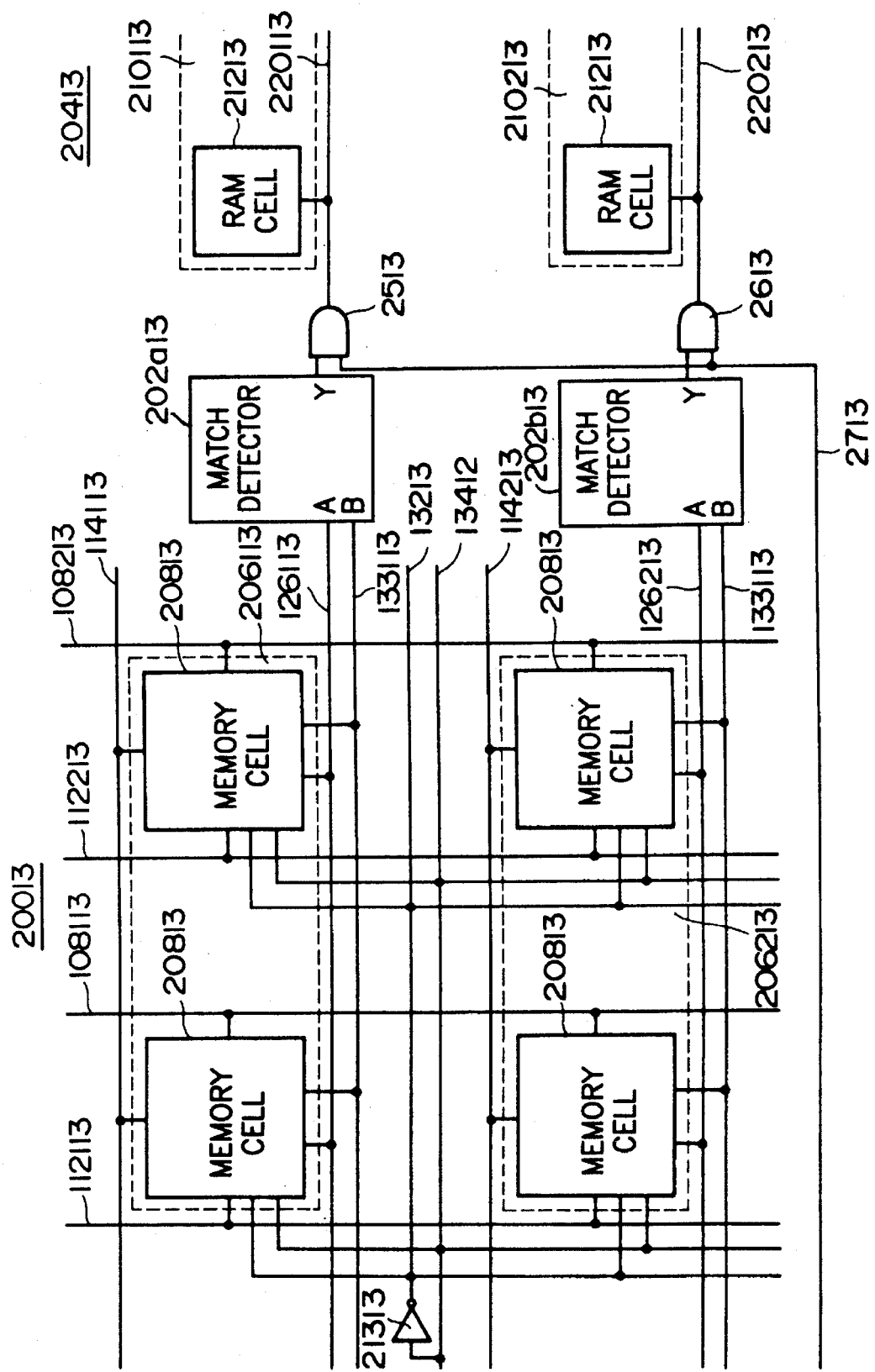
FIG. 15 is a block diagram of a semiconductor memory device according to a third embodiment of the present invention.

FIG. 15 shows an associative storage memory device according to a third embodiment of the present invention. The configuration of the associative storage memory device of FIG. 15 is the same as that of the device shown in FIG. 14, except that AND gates 2513, 2613, . . . receive a signal on a retrieval control signal line 2713 through a control unit, rather than the signal on the inverted output control signal line. The additional reference numeral "12" at the end of each of the reference numeral of each of the corresponding components shown in FIG. 14 is changed to "13". This device operates in the same manner as the device shown in FIG. 3 and 14.

Figure 16:
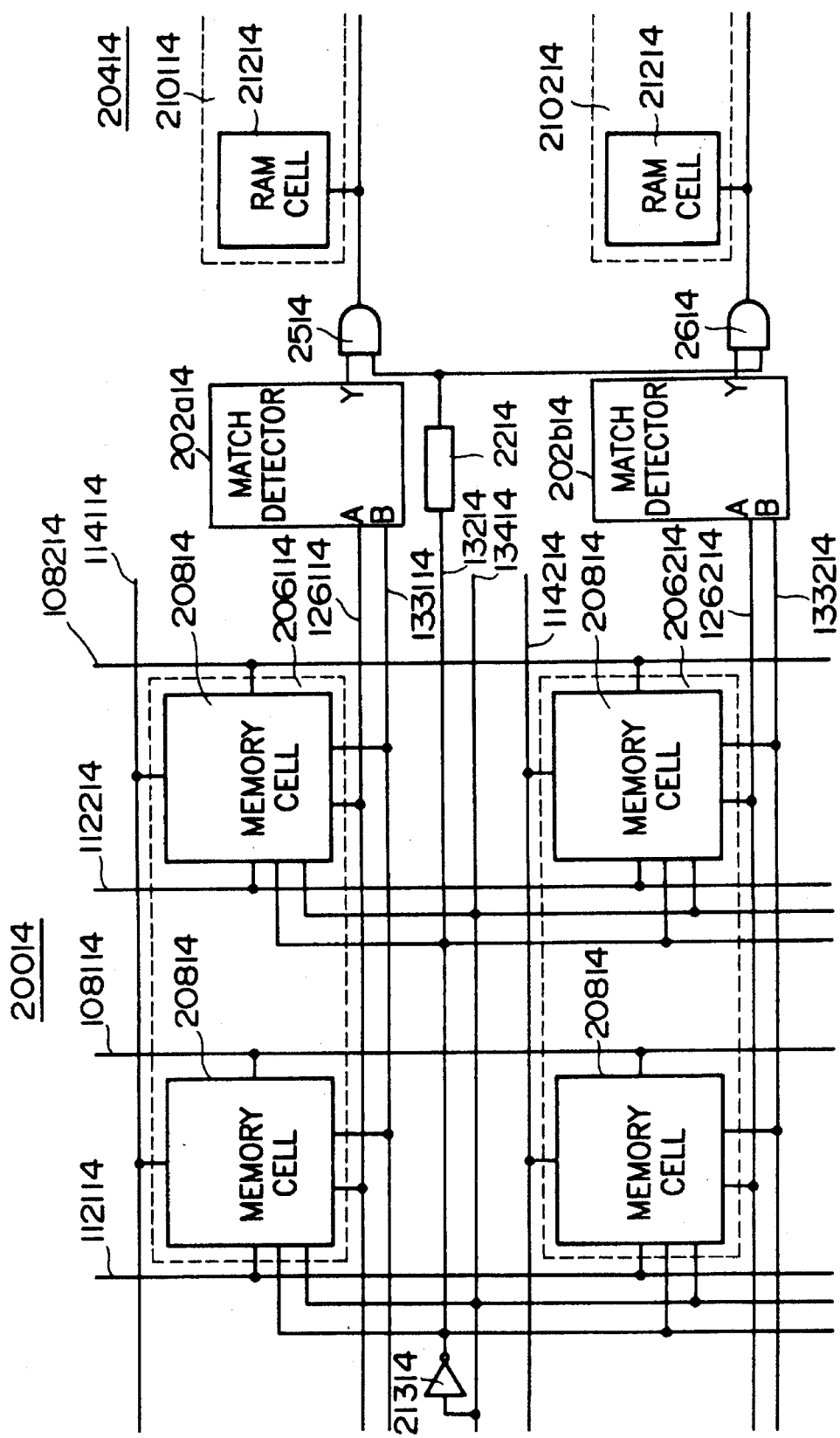
FIG. 16 is a block diagram of a semiconductor memory device according to a fourth embodiment of the present invention.

An associative storage memory device according to a fourth embodiment of the present invention is shown in FIG. 16. This embodiment is a modified version of the one shown in FIG. 14. AND circuits 2514, 2614, . . . which correspond to the AND circuits 2512, 2612, . . . of FIG. 14 receive an output signal on an inverted output control signal line 13214 via a delay circuit 2214. The remaining portions are the same as the FIG. 14 embodiment. The added numeral "12" at the end of the reference numeral of each of the corresponding components of FIG. 14 have been changed to "14", and the operation is not specifically described.

The delay time imparted by the delay circuit 2214 is equal to a time period from a time when, for example, the inverted output control signal changes to the high level to a time when the level of the output terminal of a match detecting circuit in an associative memory 20014 becomes low in response to mismatch between stored information and retrieval information. Accordingly, the time at which a signal applied to the AND circuit 2514, for example, from a match detecting circuit 202a14 which has detected an information mismatch changes from the high level, to the low level is the same as the time at which a signal applied from the delay circuit 2214 to the AND circuit 2514 changes from the low level to the high level. Thus, a RAM 20414 can perform stable operation.

Figure 17:
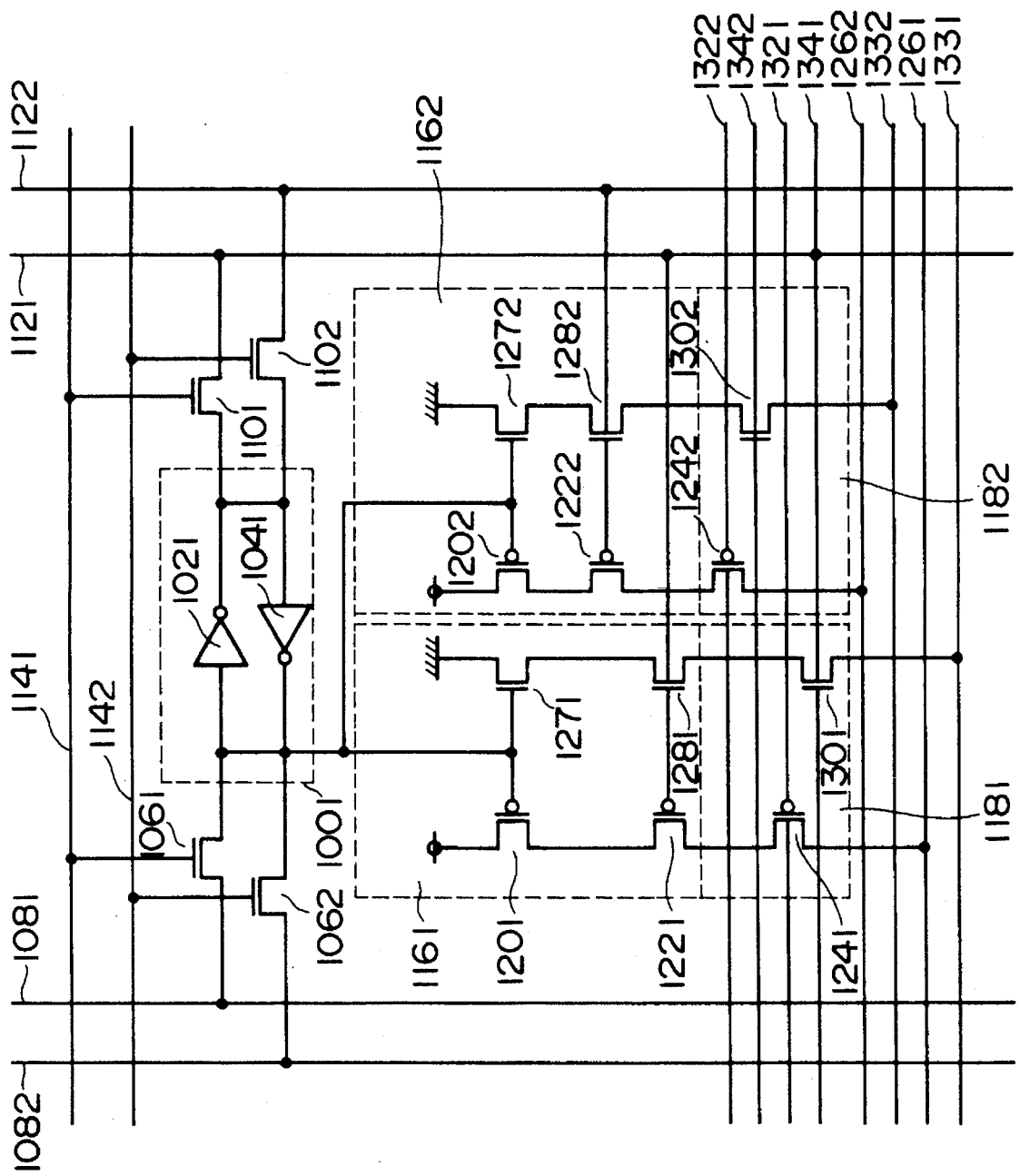
FIG. 17 is a block diagram of a semiconductor memory device according to a fifth embodiment of the present invention.

FIG. 17 shows an associative storage memory device according to a fifth embodiment of the present invention. The present invention is embodied in a dual-port associative storage memory device. Two bit lines 1081 and 1082, two inverted bit lines 1121 and 1122, two retrieval circuits 1161 and 1162, and two gate circuits 1181 and 1182 are associated with an information hold circuit 1001 comprising inverters 1021 and 1041.

The junction of the input of the inverter 1021 of the information hold circuit 1001 and the output of the inverter 104/(the signal level developed at this junction being considered to be stored information of the information hold circuit 1001) is connected through N-channel MOS transistors 1061 and 1062 acting as transmission gates to the bit lines 1081 and 1082, respectively. The junction of the output of the inverter 1021 and the input of the inverter 1041 are connected through N-channel MOS transistors 1101 and 1102 to the inverted bit lines 1121 and 1122, respectively.

Each of the retrieval circuits 1161 and 1162 has the same configuration as the retrieval circuit 116 shown in FIG. 4. Although the transistors 120 and 127 of the retrieval circuit 116 receive the inverted version of stored information of the information hold circuit 100, N-channel MOS transistors 1201 and 1202 and the P-channel MOS transistors 1271 and 1272 of the retrieval circuits 1161 and 1162 receive the stored information of the information hold circuit 1001 directly.

Then, the gates of the P-channel MOS transistor 1221 and the N-channel MOS transistor 1281 of the retrieval circuit 161 are connected to the inverted bit line 1121 rather than the bit line, and, similarly, the gates of the P-channel MOS transistor 1222 and the N-channel MOS transistor 1282 of the retrieval circuit 1162 are connected to the inverted bit line 1122.

Each of the gate circuits 1181 and 1182 has the same configuration as the gate circuit 118 of FIG. 4. However, the gate circuit 1181 has its own match lines 1261 and 1331 and its own output control signal line 1341 and inverted output control signal line 1321, and the gate circuit 1182 has its own match lines 1262 and 1332 and its own output control signal line 1342 and inverted output control signal line 1322.

Since the dual port associative storage memory device of FIG. 17 includes two bit lines, two inverted bit lines, two retrieval circuits, two gate circuits, two pairs of match lines, two output control signal lines, and two inverted output control signal lines, it is possible to retrieve information from it while another information retrieval for the information hold circuit 1001 is being performed. Such retrieval, read-out and write-in operations are the same as explained with respect to the memory cell of FIG. 4, and, accordingly, prior to each of the retrieval, read-out and write-in operations, the bit lines and the inverted bit lines are precharged.

The modified versions of the retrieval circuit and the gate circuit shown in FIGS. 5–11 can be also used for this dual port associative storage memory device.

What is claimed is:

1. A semiconductor memory device comprising:

an associative memory including a plurality of words, and two match lines provided for each of said words, means for precharging said match lines to mutually different potentials, said each of said words having means for maintaining potentials on said two match lines when stored information of said each of said words is the same as a retrieval word, and for changing a potential of one of said two match lines when said stored information of said each of said words is not the same as said retrieval word;

said one of said two match lines being a first of said two match lines when a bit of said retrieval word fails to match a corresponding bit of said each of said words and said corresponding bit is at a high level;

said one of said two match lines being a second of said two match lines when said bit of said retrieval word fails to match said corresponding bit of said each of said words and said corresponding bit is at a low level;

match detecting means associated with said each of said words of said associative memory;

said two match lines of said associated word being connected to said match detecting means;

said match detecting means having means for providing an output signal of a first state when said two match lines connected to said match detecting means maintain said mutually different potentials, respectively, and changing said output signal from said first state to a second state when one of said two match lines changes a potential thereof from a state in which said two match lines are at said mutually different potentials;

RAM means including a plurality of RAM words, each associated with a respective one of said match detecting means, RAM word lines connected to respective ones of said RAM words, control means connected to said RAM word lines, said control means having an input to which said output signal of each of said match detecting means is applied, said control means having means for, upon receiving an enabling signal, placing at a read enable potential one of said RAM word lines when said match detecting means associated with said one of said RAM word lines provides said output signal in said first state; and means for supplying said enabling signal to said control means when said output signal of said match detecting means associated with said RAM word changes from said first state to said second state.

2. A semiconductor memory device comprising:

an associative memory including a plurality of words, two match lines for each of said words, means for precharging said two match lines to a predetermined potential at a first time prior to a time of retrieval;

means for charging said two match lines to mutually different potentials at a second time prior to said time of retrieval and after said first time, said each of said words including means for maintaining said mutually different potentials of said two match lines when information stored in said each of said words is coincident with a retrieval word, and for changing one of said mutually different potentials when said information stored in said each of said words is not coincident with said retrieval word at said time of retrieval;

match detecting means associated with said each of said words of said associative memory;

said two match lines of said each of said words being connected to said match detecting means;

said match detecting means having means for providing an output signal of a first state when said two match lines connected to said match detecting means maintain said mutually different potentials, respectively, and changing said output signal from said first state to a second state when one of said two match lines connected to said match detecting means changes a respective one of said mutually different potentials;

RAM means including a plurality of RAM words associated with respective ones of said match detecting means, a plurality of RAM word lines connected to respective ones of said RAM words; and a plurality of gate means having their outputs connected to respective ones of said word lines and having their inputs connected to receive output signals from respective ones of said match detecting means, said gate means, upon receiving an enabling signal, placing at a read-enable potential the RAM word which is associated with the match detecting means that provides an output signal in said first state.

3. A semiconductor memory device according to claim 2 further comprising means for applying said enabling signal to said gate means when the output signal of the associated match detecting means changes from said first state to said second state.

4. A semiconductor memory device comprising:

an associative memory including a plurality of words, each having a first and a second match line;

said each of said words having first and second stored bits of said associative memory;

first and second pairs of bit lines for said first and second stored bits, respectively;

means for precharging said first match line to a first potential prior to a retrieval operation;

means for precharging said second match line to a second potential prior to said retrieval operation;

potentials of said first and second pairs of bit lines representing first and second retrieval bits of a retrieval word during said retrieval operation;

means for changing said first potential of said first match line when said first stored bit is at a high level and said first stored bit does not match said first retrieval bit during said retrieval operation;

means for changing said first potential of said second match line when said first stored bit is at a low level and said first stored bit does not match said first retrieval bit during said retrieval operation;

a random access memory having a plurality of RAM words, each corresponding to one of said plurality of words; and means for reading out a content of a corresponding one of said RAM words when one of said plurality of words matches said retrieval word.

5. A semiconductor memory device as in claim 4, further comprising:

a corresponding match detecting means for each of said words of said associative memory;

said first and second match lines of said each of said words being connected to said corresponding match detecting means;

said corresponding match detecting means having means for providing a first output when said first and second match lines of said each of said words maintain said first and second potentials, respectively, and for providing a second output when at least one of said first and second potentials changes;

control means for controlling said means for reading out; and said means for reading out a corresponding one of said RAM words including means for supplying said output of said corresponding match detecting means to said control means.

6. A semiconductor memory device comprising:

an associative memory having words, and two match lines for each of said words;

said each of said words including bits;

means for precharging said match lines to mutually different potentials;

said each of said words having means for maintaining said mutually different potentials of said two match lines of said each of said words when said each of said words is identical to a retrieval word, and for changing a potential of at least one of said two match lines when at least one of said bits of said each of said words is different from a corresponding bit of said retrieval word;

said at least one of said two match lines being a first of said two match lines when said at least one of said bits is at a high level;

said at least one of said two match lines being a second of said two match lines when said at least one of said bits is at a low level;

a match detector for said each of said words of said associative memory connected to said first and second match lines of said each of said words;

said match detector including means for generating a first output signal when said first and second match lines connected thereto maintain said mutually different potentials, and for generating a second output signal when a respective one of said mutually different potentials of said first and second match lines connected thereto changes;

a random access memory including a RAM word for said each of said words;

at least one RAM word line for each of said RAM words for controlling output of said each of said RAM words;

control means connected to said at least one RAM word line and connected to receive said first and second output signals from said match detector of said each of said words;

said control means having means for placing at a read enable potential said at least one RAM word line when said match detector of said each of said words generates said first output signal.

7. A semiconductor memory device comprising:

an associative memory including a plurality of words, and two match lines for each of said words, means for precharging said two match lines to a predetermined potential during a first time prior to a retrieval operation;

means for precharging said two match lines to mutually different potentials during a second time prior to said retrieval operation;

said each of said words having means, during said retrieval operation, for maintaining potentials on said two match lines when stored information of said each of said words is the same as a retrieval word, and for changing a potential of one of said two match lines when stored information of said each of said words is not said same as said retrieval word;

match detecting means associated with said each of said words of said associative memory;

said two match lines of said associated word being connected to said match detecting means;

said match detecting means having means for generating a first output signal when said two match lines maintain said mutually different potentials, respectively, and generating a second output signal when one of said two match lines changes a potential thereof;

RAM means including a plurality of RAM words, each associated with a respective one of said match detecting means, RAM word lines connected to respective ones of said RAM words, control means connected to said RAM word lines, said control means having an input to which said output signals of each of said match detecting means is applied, said control means having means for, upon receiving an enabling signal, placing at a read enable potential one of said RAM word lines when said match detecting means associated with said one of said RAM word lines generates said first output signal; and means for supplying said enabling signal to said control means when said match detecting means associated with said RAM word generates said first output signal.

8. A semiconductor memory device including an associative memory, comprising:

means for storing at least one associative word in said associative memory;

first and second match lines corresponding to each of said at least one associative word;

said first and second match lines being connected to said means for storing;

means for precharging said first and second match lines to different potentials at a first time prior to a time of retrieval;

means for outputting a signal responsive to a retrieval word and said associative word;

said signal being a change in a first potential of said first match line when a bit of said associative word is at a high level and a corresponding bit of said retrieval word is at a low level;

said signal being a change in a second potential of said second match line when a bit of said associative word is at said low level and a corresponding bit of said retrieval word is at a said high level;

a Ram word of a random access memory corresponding to said associative word; and means for outputting a content of said RAM word when said first and second potentials do not change during said time of retrieval.

9. A semiconductor memory device as in claim 8, further comprising means for precharging said first and second match lines to a predetermined potential prior to said first time.

* * * * *